US006639819B2

(12) United States Patent
Uzawa et al.

(10) Patent No.: US 6,639,819 B2
(45) Date of Patent: Oct. 28, 2003

(54) ASSOCIATIVE MEMORY APPARATUS AND ROUTING APPARATUS

(75) Inventors: Yuichi Uzawa, Kawasaki (JP); Yasuhiro Ooba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 134 days.

(21) Appl. No.: 10/011,373

(22) Filed: Oct. 22, 2001

(65) Prior Publication Data
US 2002/0172065 A1 Nov. 21, 2002

(30) Foreign Application Priority Data
May 18, 2001 (JP) ........................................ 2001-149585

(51) Int. Cl.[7] .............................................. G11C 15/00
(52) U.S. Cl. ..................... 365/49; 365/230.06; 711/108
(58) Field of Search ............................... 365/49, 230.06; 711/108

(56) References Cited

U.S. PATENT DOCUMENTS 6,278,289 B1 * 8/2001 Guccione et al. ............. 326/40
6,388,909 B2 * 5/2002 Takahashi et al. ............ 365/49

FOREIGN PATENT DOCUMENTS

JP         11-073782         3/1999

* cited by examiner

Primary Examiner—Van Thu Nguyen
(74) Attorney, Agent, or Firm—Katten Muchin Zavis Rosenman

(57) ABSTRACT

An associative memory apparatus has such a structure as to reduce a load of an updating work and readily cope with an increase of the capacity. The associative memory apparatus outputs longest prefix match in only one searching operation, thereby shortening a processing time for the searching process. The apparatus comprises entry units, each of which includes a logical operating means outputting information about a bit length not masked in entry data when the entry data stored in its own entry unit coincides with bit data that is a key, and a search result outputting means outputting a search match information with respect to the search key only when the entry data stored in its own entry unit is entry data having the longest bit length not masked.

20 Claims, 16 Drawing Sheets

PREFIX MATCH
LINE OUTPUT

LONGEST PREFIX MATCH
LINE OUTPUT

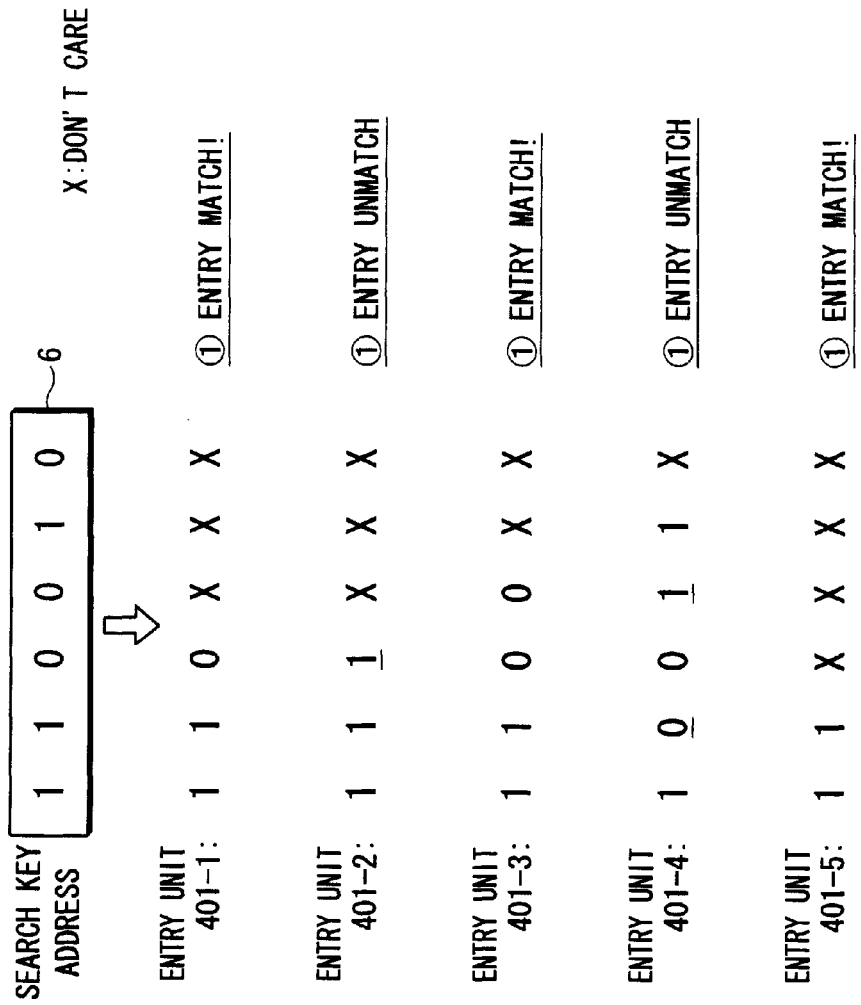

US 6,639,819 B2

ASSOCIATIVE MEMORY APPARATUS AND ROUTING APPARATUS

BACKGROUND OF THE INVENTION

1) Field of the Invention

The present invention relates to an associative memory apparatus and a routing apparatus suitable for use in address switching at a relay point in a network, for example.

2) Description of the Related Art

With rapid spread of use of the Internet technology, speed-up of the network becomes more important issue. Particularly, a router that is a relay point in the network is required to distribute a packet (for example, IP [Internet Protocol] datagram) flowing in the network on a proper route in a high-speed routing operation.

In such the routing operation on the network, a CAM (Content Addressable/Associative Memory) device is heretofore used as an apparatus for searching a destination address. The CAM device performs a process to search a destination address for an inputted packet by hardware.

When used as the above destination address searching apparatus, the CAM device is required to have a function of performing a, so-called, Longest Prefix Match searching to select the longest prefix bits which are not masked among addresses matching in the search.

As the CAM device performing the above longest prefix match searching, there is a Ternary-CAM 100 as shown in FIG. 15, for example. The ternary CAM 100 searches for a matching address (a coinciding address in the address bit matching) among entered destination addresses 104 on the basis of an address 101 that is a search key.

The ternary CAM 100 shown in FIG. 15 comprises a plurality of entry units 103-1 to 103-n, each of which can store a destination address (address 1 to n) and prefix bits 105 corresponding to the destination address 104, match lines 102 provided for the respective entry units 103-1 to 103-n, and a priority encoder 106.

The destination addresses 104 stored in the respective entry units 103-1 to 103-n are beforehand arranged in order of length of consecutive bits (a length of consecutive bits of value "1") in the prefix bits 105.

In the case of value "1" in the prefix bits 105, a condition that a result of matching is not ignored is given in the matching of corresponding address bit digit. In the case of value "0", a condition that a result of the matching is ignored (Don't care condition) is given in the matching of corresponding address bit digit.

In this case, a destination address having the longest prefix bits 105 is stored in the entry unit 103-1, and a destination address having the second longest prefix bits is stored in the entry unit 103-2. In the entry units 103-3 to 103-n, destination addresses are stored in order of length of the prefix bits.

When search match signals (match) from the entry units 103-1 to 103-n compete, the priority encoder 106 outputs a search match signal having a longer prefix bits 105 from the entry unit 103-1, 103-2, . . . or 103-n as a result of the searching.

FIG. 16 is a block diagram showing a CAM cell configuring each of the entry units 103-1 to 103-n shown in FIG. 15. Namely, each of the entry units 103-1 to 103-n comprises the CAM cells 200 shown in FIG. 16 in number corresponding to bits assumed to configure a destination address.

One CAM cell 200 comprises a data register 201 for storing address data of one bit configuring a destination address, a mask register 202 for storing a prefix bit of one bit corresponding to the address data, a comparator 203 for comparing address data from the data register 201 with address data that is a search key from bit lines 206 and 207, and a mask circuit 204 for performing a masking process (refer to a reference character 208) on the basis of a value of the mask register 202.

With the above structure, in the ternary CAM 100 show in FIG. 15, a search for coincidence with an address that is a search key is made in each of the ternary units 103-1 to 103-n. An entry unit 103-1, 103-2, . . . , or 103-n storing a destination address matching with the address that is a search key outputs this effect as a search match signal (match signal) to the priority encoder 106 through the match line 102.

In this case, all entries (destination addresses stored in the entry units 103-1 to 103-n) are arranged in order of length of the prefix bits 105 and accommodated. Therefore, when a plurality of destination addresses match, the priority encoder 106 outputs a match signal from the entry unit 103-1, 103-2, . . . , or 103-n given the highest priority among matching destination addresses in the search as a result of the longest prefix match.

In order to appropriately obtain a result of the longest prefix match in the ternary CAM 100 in FIG. 15, it is necessary to beforehand arrange all entries in order of length of the prefix and accommodate them. Namely, when a new distribution destination is registered or when a distribution destination that becomes not to be used is deleted, it is necessary to add or delete the entry.

When an entry is added, an entry unit 103-1, 103-2, . . . or 103-n to which the entry should be inserted is determined according to the length of the prefix among the entry units 103-1 to 103-n, entries lower than the relevant position are moved down, an entry unit 103-1, 103-2, . . . or 103-n at a position at which the new entry should be added is emptied, after that, the entry to be added is stored. Whereby, the entry can be added without breaking the order of length of the prefix.

When an entry is added or deleted as above, it is necessary to rearrange all the entries in order of prefix, and again accommodate them. However, a series of this updating work requires a considerable time. Moreover, it is necessary to stop the CAM device in service.

Since a high-speed, continuous operation of the CAM device is required to more speed up the network, such the updating work causes serious interruption. With spread of the Internet, there is a demand for a larger-capacity of the CAM because of an increase of the number of entries, or an increase of the number of address bits under application of IPv6 (Internet Protocol version 6). When such the updating work is done on a CAM having a large capacity, a load of the work more increases.

U.S. Pat. No. 6,144,574 discloses an apparatus which accommodates an entry of an arbitrary length at an arbitrary position, obtains a result of full match (multi-match) searching and the longest prefix length in the first search cycle, feeds back the longest prefix length obtained in the first cycle in the second cycle, again carries out the searching operation on the prefix of all the entries, and outputs a matching entry as a result of the longest prefix match searching, while reducing a load of the updating work.

However, the above apparatus requires two search cycles as the searching process. For this, there is a problem that the speed-up is disturbed even in such the configuration where two search cycles are required. In order to satisfy a demand for speed-up and larger-capacity of the above CAM device, it is necessary to provide a technique for more shortening a processing time required to carry out the above searching process twice.

SUMMARY OF THE INVENTION

In the light of the above problems, an object of the present invention is to provide an associative memory apparatus and a routing apparatus, which can reduce a load of the updating work, readily cope with an increase of the capacity, and shorten a time for the searching process by outputting longest prefix match in one searching operation.

The present invention therefore provides an associative memory apparatus comprising a plurality of entry units storing bit data to be searched and entry data differing from one another having mask identifying data for masking a necessary bit length required by the bit data, and matching each of the entry data with the bit data that is a search key, a matching-masking state outputting means inputted information reflecting a result of the matching in units of the same bit digit in each of the entry units and a mask identifying bit at the bit digit to output reflected result information mutually reflected among the entry units at each bit digit, each of the entry units comprising a logical operating means for outputting information about a bit length not masked of the entry data by a logical operation using the reflected result information from the matching-masking state outputting means when the entry data stored in its own entry unit matches with the bit data that is the key as a result of the matching, and a search result outputting means for outputting search match information about the search key on the basis of an output signal from the logical operating means only when the entry data stored in its own entry unit is entry data having the longest bit length not masked among all entry data coinciding with the bit data that is the key in the matching.

In the above associative memory apparatus, the entry unit may comprise associative memory cells in number equal to at least bits of the entry data to divide the entry data into data each of one bit and storing the data, and matching the entry data with the bit data that is the search key in units of divided one bit, and a matching result outputting means for reflecting results of matching from the associative memory cells to output information about whether a whole of the entry data coincides with the bit data that is the key as a result of the matching.

Preferably, the associative memory cell comprises a data register for dividing the data to be searched into data each of one bit and storing the divided data, a mask register for storing a mask identifying bit corresponding to the data of one bit stored in the data register, and a matching circuit for matching the bit data that is the key with the entry data in units of divided one bit using bits stored in the data register and the mask register, and the logical operating means comprises a logical operation circuit for performing a logical operation in units of the divided one bit. The logical operation circuit comprises a first logical operation element, only when information that a mask identifying bit from the mask register represents that data of one bit stored in a corresponding data register is not masked and information about coincidence between the entry data and the bit data as a result of the matching from the matching result outputting means are inputted, outputting this effect as a first operation result to the matching-mask state outputting means, and a second operation element, only when a logical operation result from the first logical operation element is the first operation result and an output result from the matching-masking state outputting means at the adjacent bit digit is other than the first operation result, outputting this effect as a second operation result to the search result outputting means. And, the search result outputting means outputs the search match information when inputted the second operation result from the second logical operation element.

In the above associative memory apparatus, the matching-masking state outputting means may be configured with a line stretched in common among the associative memory cells storing bits at the same digit of the entry data.

The associative memory apparatus according to this invention may comprise an external connecting means for connecting a plurality of entry blocks to one another, each of which entry blocks comprises a plurality of the entry units, wherein the matching-masking state outputting means outputs the result information mutually reflected among the entry units configuring each of the entry block through the external connecting means.

In the above associative memory apparatus, preferably, the external connecting means connects in series or in parallel the matching-masking state outputting means in each of the entry blocks. In such case, a control circuit for disconnecting at least one entry block among a plurality of the entry blocks connected to one another may be interposed in the external connecting means.

Each of the entry blocks may comprise an encoding means for encoding output signals from the matching-masking state outputting means, and the external connecting means may comprise a bus line being able to bus-communicate the output signals encoded by the encoding means among the entry blocks.

The matching-masking state outputting means may be configured with a line stretched in common among the associative memory cells storing bits at the same digit each of which is a part of each entry data.

In such case, the matching-masking state outputting means may be configured with a line stretched in common among the associative memory cells storing bits at the same digit in higher bits excluding at least lower one bit of each entry data.

Further, at least lower one bit of each of the entry data may be a weight bit giving a weight in matching of bit data to be searched.

Alternatively, the matching-masking state outputting means may be configured with a line stretched in common among the associative memory cells storing bits at the same digit in lower bits excluding at least higher one bit of each entry data. Further, at least one bit of each of the entry data may be weight bit giving a weight in matching of bit data to be searched.

Preferably, the search result outputting means is configured with a wired-connection line wired-connecting output signals from the second logical operation elements. The matching-masking state outputting means is configured with a wired-connection line wired-connecting output signals from the first logical operation elements. The first logical operation element or the second logical operation element may be configured with a CMOS logical circuit, an NMOS logical circuit, or a PMOS logical circuit.

The present invention further provides a routing apparatus comprising an associative memory storing a destination address correspondingly to an output destination route, and an output route determining unit analyzing a destination address attached to an inputted packet, and performing a routing process such that the packet is transferred to an output destination route obtained by referring to the associative memory, the routing apparatus comprising the associative memory cell comprising a plurality of entry units for storing bit data configuring a destination address to be searched and entry data differing from one another having mask identifying data for masking a necessary bit length in the bit data, and matching the entry data with the bit data configuring the destination address that is a search key, a matching-masking state outputting means inputted information reflecting a result of the matching in units of the same bit digit in each of the entry units and a mask identifying bit at the bit digit to output reflected result information mutually reflected among the entry units at each bit digit, each of the entry units comprising a logical operating means for outputting information about a bit length not masked of the entry data by a logical operation using the reflected result information from the matching-masking state outputting means when the entry data stored in its own entry unit matches with the bit data that is a key as a result of the matching, and a search result outputting means for outputting search match information about the search key on the basis of an output signal from the logical operating means only when the entry data stored in its own entry unit is entry data having the longest bit length not masked among all entry data coincides with the bit data that is a key in the matching.

According to this invention, the entry unit has the logical operation means and the search result outputting means. It is thereby possible to reduce a load of the updating work to shorten the time, and readily cope with an increase of the capacity. It is also possible to output a longest prefix match result in one searching operation without a clock, shorten the searching time, simplify the updating work, and shorten the time. This contributes to speed-up of the network.

According to this invention, a plurality of entry blocks may be mutually connected by the external connecting means, which provides similar advantages to those provided by the first embodiment. It is also possible to increase the entry data that the apparatus can accommodate as a whole, and readily cope with an increase of the number of entries in the network.

BRIEF DESCRIPTION OF THE DRAWINGS

FIG. 4(a) is a diagram equivalently showing a prefix match line; whereas

FIGS. 5 through 8 are diagrams for illustrating an operation according to the first embodiment of this invention;

DESCRIPTION OF THE PREFERRED EMBODIMENTS

Hereinafter, description will be made of embodiments of this invention with reference to the drawings.

(1a) Description of First Embodiment

Figure 1:
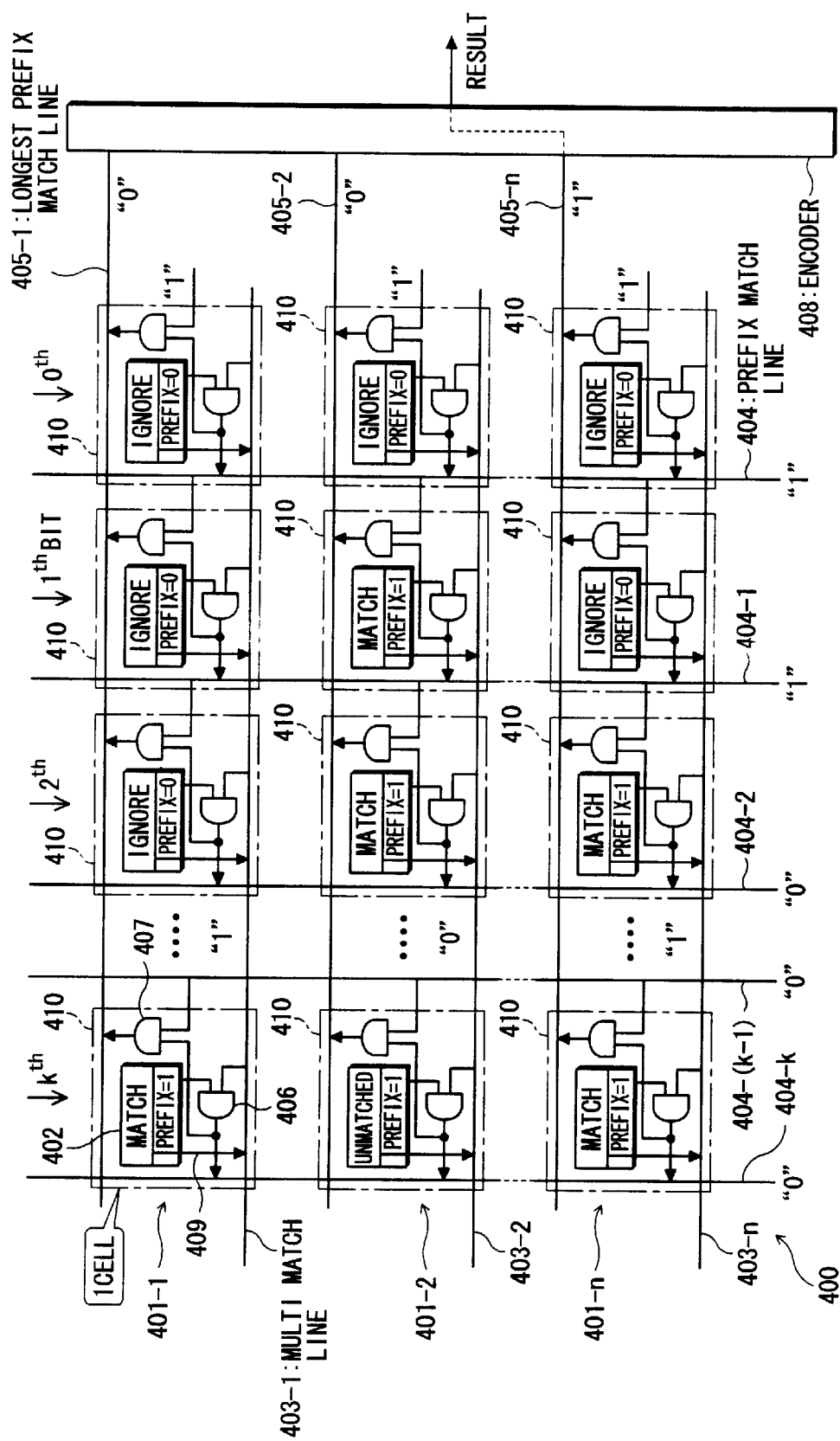
FIG. 1 is a diagram showing a CAM as an associative memory apparatus according to a first embodiment of this invention.

FIG. 1 is a diagram showing a CAM as an associative memory apparatus according to a first embodiment of this invention. A CAM 400 shown in FIG. 1 can be used as an address searching apparatus for searching for a route to an output destination with a destination address when performing a routing process in routers 1–5 on a network as shown in FIG. 3, for example.

Figure 3:
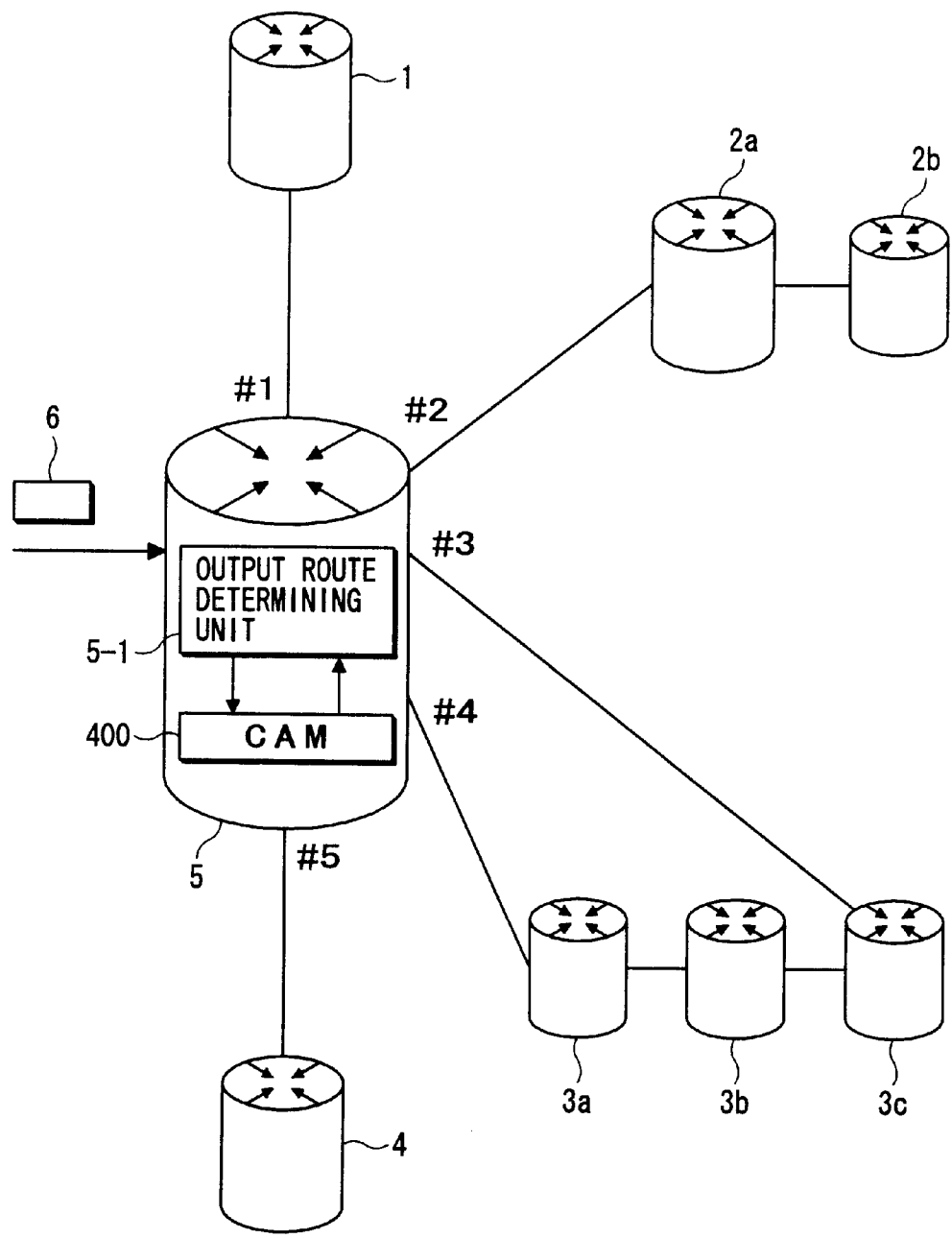
FIG. 3 is a diagram showing a network structure according to the first embodiment of this invention.

Namely, the router 5 shown in FIG. 3 analyzes a destination address attached to an inputted packet, and searches for an output port for the inputted pocket by referring to destination addresses stored in the CAM 400 correspondingly to output ports #1–#5 as output destination routes.

In concrete, the router (routing apparatus) 5 comprises an output route determining unit 5-1 which analyzes a destination address attached to an inputted packet and performs a routing process such that the packet is transferred from an output port obtained as a result of searching in the CAM 400, along with the above CAM 400. In FIG. 3, the output ports #1–#5 are connected to routers 1, 2a, 3c, 3a and 4, respectively.

By applying the associative memory apparatus 400 according to the first embodiment to the router 5, it is possible to search for an output port number of a route to be connected at a high speed according to a destination address (for example, an IP address) attached to an inputted packet 6. The router 5 can thereby transfer the packet from an output port of an obtained number to any one of the routers 1, 2a, 3a, 3c or 4.

The associative memory apparatus 400 comprises, as shown in FIG. 1, n entry units 401-s (s=1 to n), and prefix match lines 404, 404-1, . . . and 404-k in number equal to bits that the entry data occupies (k bits in FIG. 1) plus one bit.

Figure 15:
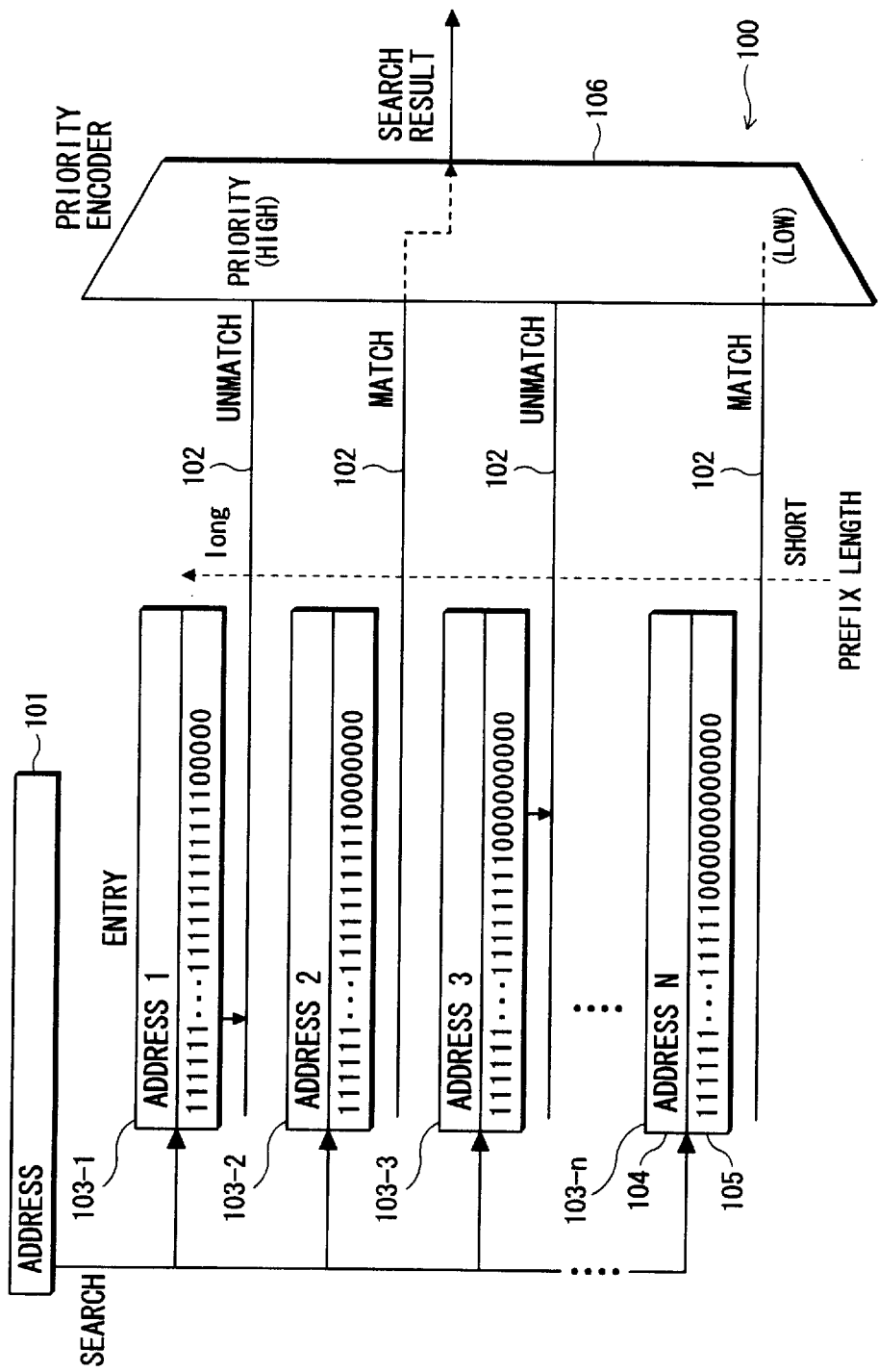
FIG. 15 is a diagram showing a ternary CAM as a CAM device performing longest prefix match searching.

Like the above CAM device 100 shown in FIG. 15, the entry unit 401-s stores entry data composed of destination address as bit data to be searched and prefix bits that can function as mask identifying bits for masking a necessary bit length in each of the destination addresses, and matches the entry data with bit data that is a search key.

In concrete, a prefix bit of value "1" is to identify that a corresponding address bit digit is not masked, whereas a prefix bit of value "0" is to identify that a corresponding address bit digit is masked, as will be described later.

The CAM 400 is inputted address bits attached to a packet 6 shown in FIG. 3 as a search key from the output route determining unit 5-1, matches it with each of an IP address showing an area of the router 1, 2a, 3a, 3c or 4 shown in FIG. 1 as entry data, and extracts an output port number coinciding (matched) in the matching.

Each of prefix match lines 404-1 to 404-k outputs a matching state of a result of the matching of each bit (prefix bit) not masked at the same digit with bit data that is a search key among address data coinciding with the bit data that is the search key in the entry units. The prefix match line 404 fixedly outputs a state "1".

Each of the entry units 401-s can match entry data composed of prefix bits that are not masked having the longest k bits.

In other words, each of the prefix match lines 404, 404-1, . . . , and 404-k is inputted information reflecting a result of bit-by-bit matching at the same bit digit in each of the entry units 401-s and mask identifying bit at that bit digit, and outputs it as reflected result information reflected mutually among the entry units 401-s at each bit digit, which has a function as a matching-masking state output means.

The above entry unit 401-s comprises associative memory cells 410, a multi match line 403-s, and a longest prefix match line 405-s.

The associative memory cells 410 are transversally arranged in the row, in number equal to bits that the entry data occupies (k bits in FIG. 1) plus one bit. The associative memory cell 410 in each of the entry unit 401-s has a structure shown in FIG. 2, as will be described in detail later.

The multi match line 403-s can reflect results of matching from the associative memory cells 410, and output information about whether the results as the whole entry data coincide with bit data that is a key in the matching, which has a function as a matching result outputting means.

The longest prefix match line 405-s outputs a longest prefix match signal as a search match information with respect to a search key on the basis of output signals from AND circuits 407 to be described later only when entry data stored in its own entry unit 401-s is entry data having the longest bit length not masked among all entry data coinciding in the matching with the bit data that is the search key, which functions as a search result outputting means.

The encoder 408 is inputted state signals from the longest prefix match lines 405-s, and outputs encode information about a search match address having the longest bit length not masked to the external output route determining unit (refer to a reference character 5-1 in FIG. 3).

Figure 2:
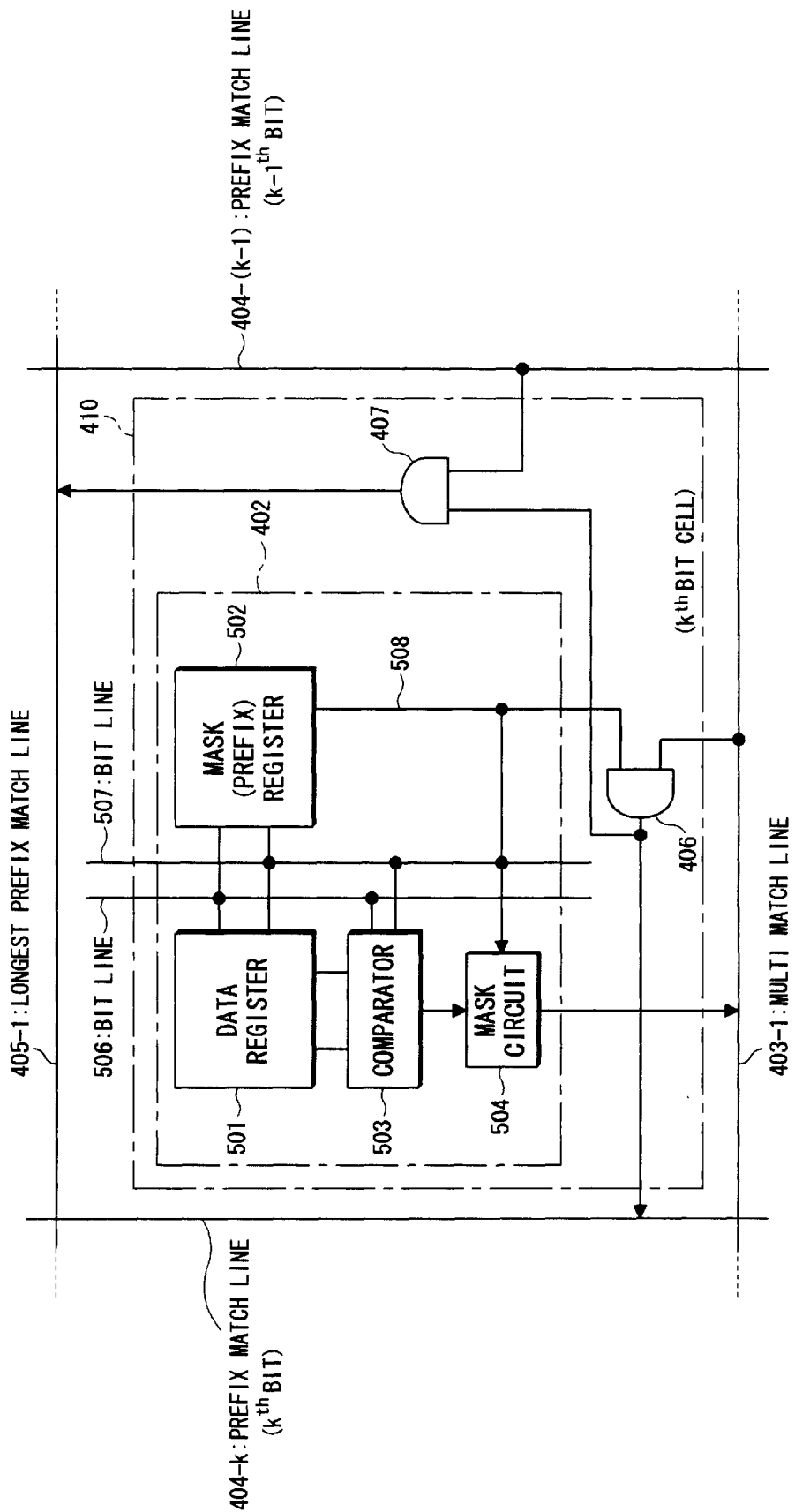
FIG. 2 is a block diagram showing an associative memory cell according to the first embodiment of this invention.
Figure 16:
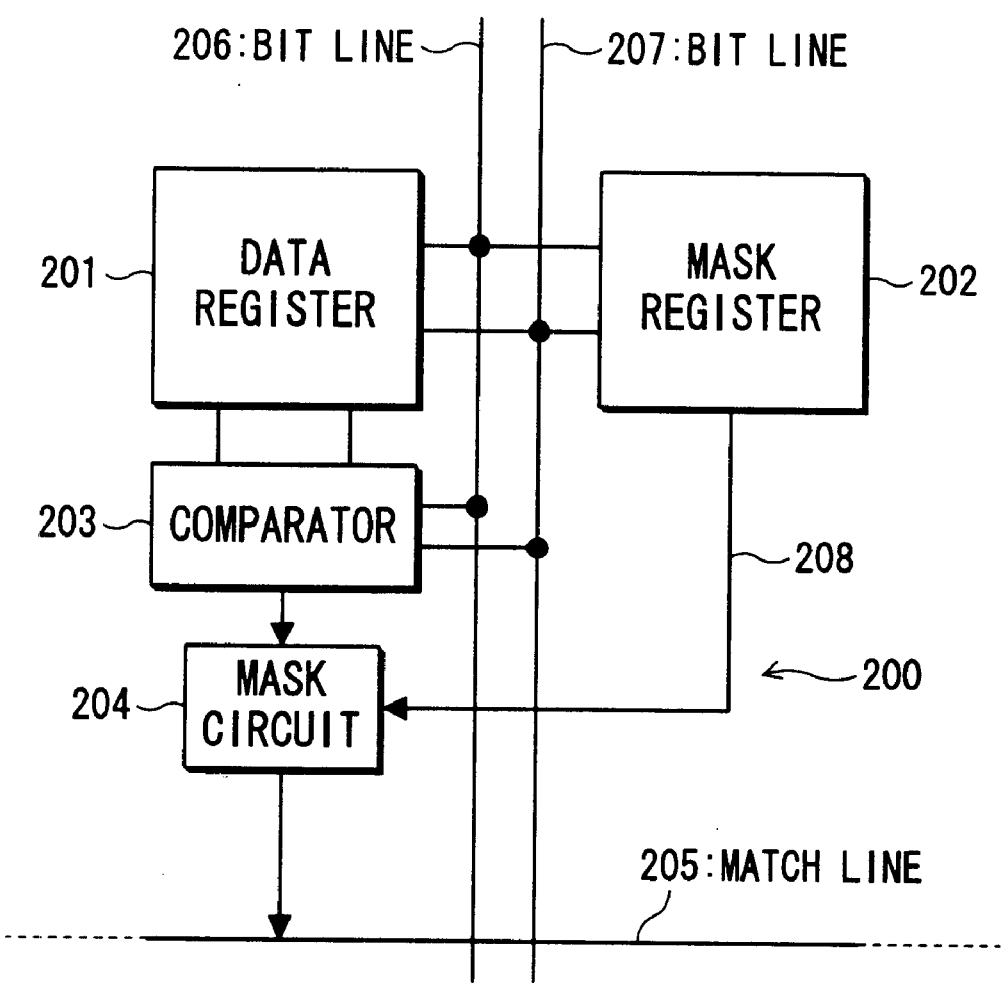
FIG. 16 is a block diagram showing a CAM cell configuring an entry unit in FIG. 15.

The associative memory cell 410 comprises, as shown in FIG. 2, a data register 501, a mask register 502, a comparator 503, a mask circuit 504, and AND circuits 406 and 407. Incidentally, a circuit unit 402 configured with the data register 501, the mask register 502, the comparator 503 and the mask circuit 504 has basically a similar structure to that described above shown in FIG. 16.

Hereinafter, the description will be made, focusing on a structure of the associative memory cell 410 (the one in the upper left hand corner in FIG. 1) storing the highest order bit (the k-th bit) in the entry unit 401-1, for the sake of convenience.

The data register 501 divides address data to be searched into data each of one bit, and stores it. The mask register 502 stores a mask identifying bit corresponding to the data of one bit stored in the data register 501. The address data and the mask identifying bit are inputted as setting data from a main control apparatus or the like not shown through bit lines 506 and 507.

The data registers 501 of the respective memory cells 410 configuring the entry unit 401-s cooperate to store all bits of the address data, whereas the mask registers 502 of the respective associative memory cells 410 configuring the entry unit 401-s cooperate to store all bits of the mask identifying data.

With respect to the above mask identifying bit, "1" is designated as a prefix bit digit that is not masked, whereas "0" is designated as a bit digit that is masked.

The comparator 503 compares address data of one bit stored in the above data register 501 with bit data corresponding to address data that is a search key inputted through the bit lines 506 and 507. A result of the comparison is outputted to the mask circuit in the following stage.

The mask circuit 504 applies a mask condition stored in the mask register 502 to the result of the comparison from the comparator 503, and outputs it. In concrete, the mask circuit 504 is inputted a bit value stored in the mask register 502, and outputs a match signal representing coincidence in the matching to the above multi match line 403-1 when the bit value is "0" representing "Don't care condition" or "ignore" irrespective of the result of the comparison from the comparator 503 (even if the result of the comparison from the comparator 503 is "unmatched") (refer to a reference number 409 in FIG. 1).

The multi match line 403-s is inputted the above results of the matching from the mask circuits 504 in the respective associative memory cells 410 configuring the entry unit 401-s, and brought into a multi match state "1" only when match signals are inputted as results of the matching in the mask circuits 504 of all the associative memory cells 410. When not, the multi line 403-s is brought into an invalid state "0".

In other words, the multi match line 403-s becomes invalid "0" when there is even one "unmatch" among bits in the entry unit 401-s. Only when all the bits are "match" or "ignore", the multi match line 403-s becomes valid "1".

The above comparator 503 and mask circuit 504 in combination have a function as a matching circuit which matches data that is a search key with entry data in units of divided one bit, using bits stored in the data register 501 and the mask register 502.

The AND circuit 406 carries out an AND operation between a bit value stored in the mask register 502 and a state value of the multi match line 403-1 of its own entry unit 401-1. A result of the AND operation is outputted to the AND circuit 407 and the prefix match line 404-k.

In other words, the AND circuit 406 functions as a first logical operation element for outputting "1" as a first operation result to the prefix match line 404-k only when the mask identifying bit from the mask register 502 represents that the data of one bit stored in the corresponding data register 501 is not masked and information "1" representing coincidence as a result of the matching from the multi match line 403-1 is inputted.

Each of the prefix match lines 404, 404-1, . . . and 404-k is configured with a line stretched in common among the associative memory cells 410 at the same bit digit of the entry units 401-1 to 401-n, which is wired-NOR-connected to the output of the AND circuit 406 of each of the associative memory cells 410.

Figure 4A:
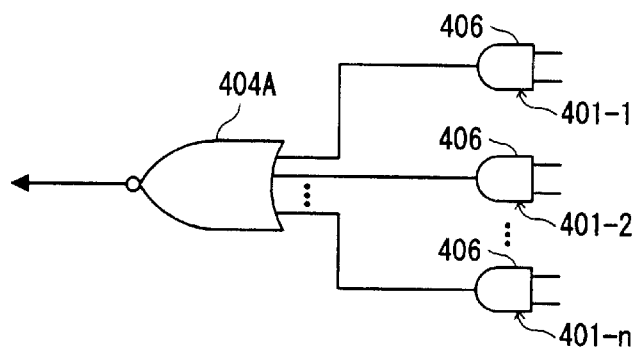

Namely, each of the prefix match lines 404, 404-1, . . . , and 404-k carries out a NOR operation with signals from the AND circuits 406 of the associative memory cells 410 at the same digit being as inputs, and outputs a result of the NOR operation, as equivalently shown as a NOR circuit 404A in FIG. 4(a). Only when output signals from the AND circuits 406 in the associative memory cells 410 at the same bit digit are all "1", the prefix match line 404 outputs "1". When not, the prefix match line 404 outputs "0". Each of the prefix match line 404-1 to 404-k outputs "1" or "0" in the same way as the above prefix match line 404.

In other words, when address data coincides with bit data that is a search key and there exists a bit digit that is not masked in the associative memory cells 410 at the same digit in the entry units 401-1 to 401-n, each of the prefix match lines 404, 404-1, . . . and 404-k notifies this effect for each bit digit.

When even only one output of the AND circuit 406 is valid "1" at the same bit digit of the entries, the corresponding bit of the prefix match line 404, 404-1, . . . or 404-k had in common by the cells of the other entries in the column is made invalid.

Meanwhile, an arrangement of values of the prefix match lines 404, 404-1, . . . and 404-k represents a bit length of the longest prefix bits among entry data coinciding in the matching.

The AND circuit 407 carries out an AND operation between a result of the AND operation in the AND circuit 406 and a state value in the prefix match line 404-(k−1) at the lower order digit configuring the entry unit 401-1. A result of the AND operation is outputted to the longest prefix match line 405-1.

In other words, the AND circuit 407 functions as a second logical operation element which, only when a result of the logical operation from the AND circuit 406 is "1" as the above first operation result, and an output result from the prefix match line 404-(k−1) at the adjacent bit digit is other than the first operation result "0", outputs this effect as a second operation result to the longest prefix match line 405-1.

Figure 4B:
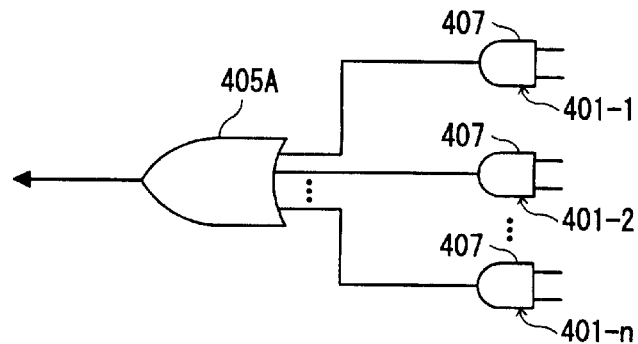
FIG. 4(b) is a diagram equivalently showing a longest prefix match line.
Figure 6:
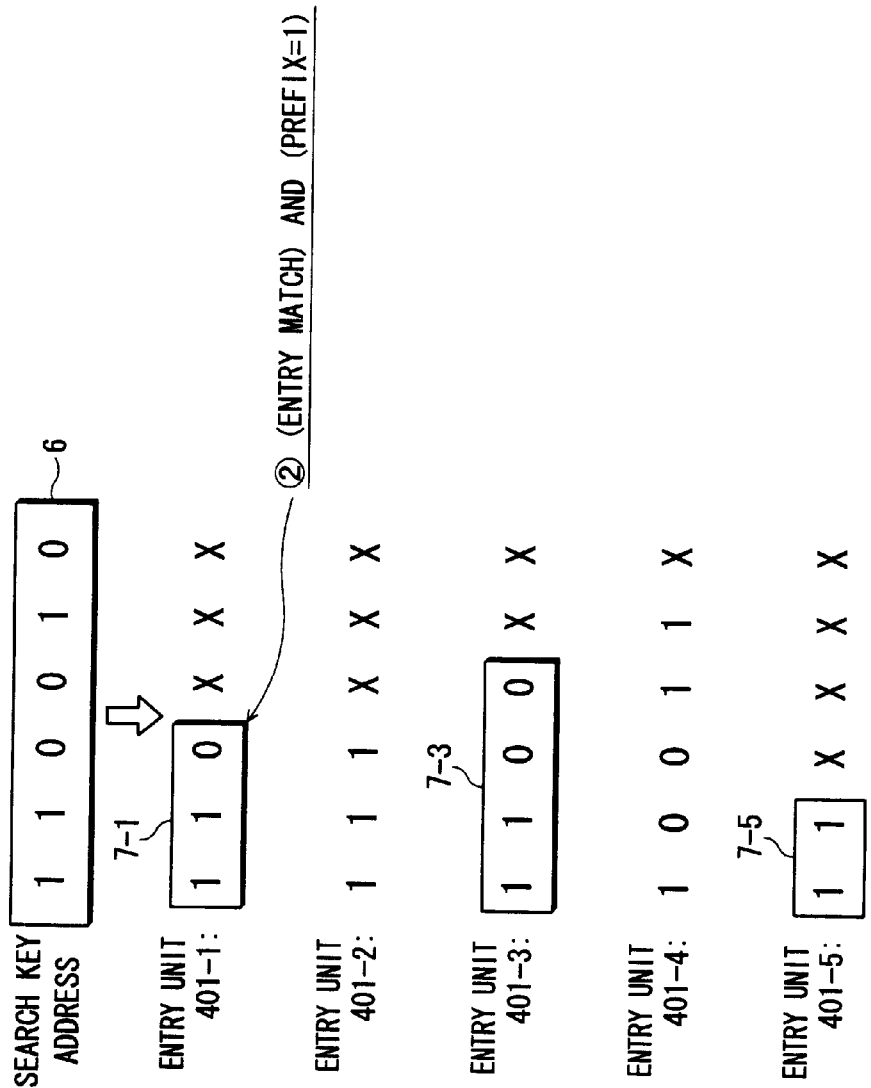

Each of the longest prefix match lines 405-1 to 405-n is wired-OR-connected to outputs of the AND circuits 407 in the associative memory cells 410 configuring the corresponding entry unit 401-1, 401-2, or 401-n. Namely, each of the longest prefix match line 405-1 to 405-n outputs a result of an OR operation with outputs of the AND circuits 407 of the associative memory cells 410 being inputs, as equivalently shown as an OR circuit 405A in FIG. 4(b).

In this case, each of the longest prefix match lines 405-1 to 405-n outputs "1" as a longest prefix match signal only when at least one of output signals of the AND circuits 407 is "1". Other than this, each of the longest prefix match line 405-1 to 405-n outputs "0".

In other words, each of the longest prefix match lines 405-1 to 405-n outputs information about address data having the longest length of bits (prefix bits) that are not masked (information about an entry unit which stores address data) among address data of the entry units 404-1 to 401-n coinciding with bit data that is a search key.

In concrete, in the case shown in FIG. 1, an entry unit storing address data having the longest prefix bits is the entry unit 401-n, and only the longest prefix match line 405-n of the entry unit 401-n outputs a longest prefix match state "1", while the longest prefix match lines 405-1 to 405-(n−1) output "0".

Accordingly, the AND circuits 406 and 407 in each of the associative memory cells 410 configuring each of the entry units 401-1 to 401-n are configured as a logical operating means which outputs information about a bit length not masked in entry data by a logical operation using the reflected result information from the prefix match lines 404, 404-1, . . . , and 404-k when entry data stored in its own entry unit coincides with bit data that is a search key. The AND circuits 406 and 407 in each of the associative memory cells 410 are configured as a logical operation circuit carrying out a logical operation in units of one bit.

Incidentally, the above AND circuits 406 and 407 can be configured with, for example, a CMOS (Complementary Metal Oxide Semiconductor) logical circuit, an NMOS (N channel MOS) logical circuit or a PMOS (P channel MOS) logical circuit.

In the associative memory cell 410 at the lowest order bit digit (the 0-th bit digit in FIG. 1) in each of the entry units 401-1 to 401-n, mask bit "0" is set in the mask register 502, whereby a value of the prefix match line 404 is fixedly set to "1".

Since the AND circuits 407 of those associative memory cells 410 have no prefix line for a lower bit, "1" is fixedly set as input values in the searching operation.

Next, description will be made of an example of the operation of the associative memory apparatus in the above structure according to the first embodiment of this invention, with reference to FIGS. 5 through 8.

The above router 5 shown in FIG. 3 performs a routing process on the inputted packet 6. Namely, the output route determining unit 5-1 in the router 5 delivers bit data as a destination address of the packet 6 to the CAM 400. The CAM 400 searches for stored address data with the delivered bit data of the destination address of the packet to determine to which output port #1, #2, . . . , or #5 the packet should be transferred.

When receiving a result of the searching from the CAM 400, the output route determining unit 5-1 transfers the packet 6 on the basis of an output destination route (output port information) obtained as a result of the searching.

Hereinafter, the searching process for an output port that is a destination in the above CAM 400 will be concretely described with reference to FIGS. 5 through 8. Incidentally, in the case shown in FIGS. 5 through 8, the entry units 401-1 to 401-5 in the CAM 400 store address data corresponding to the five routers 1, 2a, 3a, 3c and 4 on the destination's side, and a destination address of, for example, six bits (k=5) is stored as the address data stored in each of the entry units 401-1 to 401-5.

In FIGS. 5 through 8, a bit of a prefix bit "0" stored in the mask register 502 in the associative memory cell 410 in each of the entry units 401-1 to 401-5 is given "Don't care condition" represented by "X".

In this case, for example, a destination address on the side of the router 1 is entered with mask on lower order three bits in the entry unit 401-1, a destination address on the side of the router 2a is entered with mask on lower order three bits in the entry unit 401-2, and a destination address on the side of the router 3a is entered with mask on lower order two bits in the entry unit 401-3.

Further, a destination address for directly transferring to the router 3c in a higher rank than the router 3a is entered with mask on lower order one bit in the entry unit 401-4, and a destination address on the side of the router 4 is entered with mask on lower order four bits in the entry unit 401-5.

When a destination address "110010" as shown in FIG. 5 is inputted as a search key to the CAM 400, the comparators 503 in the associative cells 410 in each of the entry units 401-1 to 401-5 matches it with the entered destination address data bit by bit. When the both bits coincide as a result of the matching, the comparator 503 outputs a match signal "1" to the mask circuit 504. When the bits do not match, the comparator 503 outputs an unmatch signal "0".

At this time, in an associative memory cell 410 to which "Don't care conditionx" is given, a prefix bit outputted from the mask register 502 to the mask circuit 504 is "0", a result of the comparing operation is masked in the mask circuit 504, and a match signal is outputted.

In each of the multi match lines 403-1 to 403-5, the multi match state "1" is set when match signals are outputted from all the associative memory cells 410 of each of the entry unit 401-1 to 401-5. When even one unmatch signal is outputted, a not-multi-matched state "0" is set (refer to ① in FIG. 5).

In this case, in associative memory cells 410 at the lower order three bits to which "Don't care condition" is given in the entry unit 401-1, the match signals are outputted from the mask circuits 504 (refer to FIG. 2). In the associative memory cells 410 at the higher order three bits, the match signals are outputted from the comparators 503 via the mask circuits 504. Therefore, the multi-match state "1" is set in the multi-match line 403-1.

In the multi match lines 403-3 and 403-5 in the entry units 401-3 and 401-5, the multi match state "1" is set almost similarly to the above multi match line 403-1.

On the other hand, in the address data stored in the entry unit 401-2, the third lower order bit from the highest order bit does not coincide with the address bit of the search key. In the address data stored in the entry unit 401-4, the second bit and the fourth bit from the most significant bit do not coincide with the address bits of the search key, respectively.

The corresponding associative memory cells 410 output the unmatch signal "0", so that the not-multi-matched state "0" is set in the multi match lines 403-2 and 403-4.

The AND circuit 406 in each of the associative memory cells 410 carries out the AND operation between the prefix bit (mask identifying bit) from the mask register 502 and the state signal from the multi match line 403-1, 403-2, . . . or 403-5 to detect whether the prefix bit is "1" and its own entry is in the match state or not. In this case, bit strings 7-1, 7-3 and 7-5 in the entry units 401-1, 401-3 and 401-5 shown in FIG. 6 correspond (refer to ② in FIG. 6).

Results of the above detection obtained in the AND circuits 406 in the associative memory cells 410 are informed to the prefix match line 404-1, 404-2, or 404-k. Whereby the longest prefix bit length in all the matching entries is obtained. Namely, each of the prefix match lines 404-1 to 404-k sets the invalid state "0" when there is even one output signal of the AND circuit 406 is "1" in the associative memory cells corresponding to the same digit bit of the entered address data (refer to ③ in FIG. 7).

In this case, the entry data of the entry unit 401-3 to which the prefix bits of a higher order four-bit length are given has the longest bit length of the prefix bits stored in cooperation with the mask register 502 of the associative memory cell 410 among the three entry units 401-1, 401-3 and 401-5 in the multi match state. The invalid state "0" is set to the prefix match lines 404-3 to 404-6 at the higher order four bit digits.

Namely, lower order two bits of the entry data stored in the entry units 401-1, 401-3 and 401-5 in the multi match state are mask bits, so that the AND circuit 406 of each of the relevant associative memory cells 410 outputs "0". Accordingly, the valid state "1" is set to the prefix match lines 404-1 and 404-2.

It is possible to determine the longest prefix length on the basis of states of the above prefix match lines 404, 404-1, . . . , and 404-6. In this case, the longest prefix bit length is determined to be higher four bits at which the invalid state continues.

Further, the entry unit 401-1, 404-2, . . . or 401-5 having the above longest prefix bit length is detected by the longest prefix match lines 405-1, 405-2, . . . , and 405-5.

With respect to the mask identifying data stored in the mask registers 502 in cooperation of the associative memory cells 410, a range of bit digits that are not masked is configured with a string of bits of "1", whereas a range of bit digits that are masked is configured with a string of bits of "0".

Figure 7:
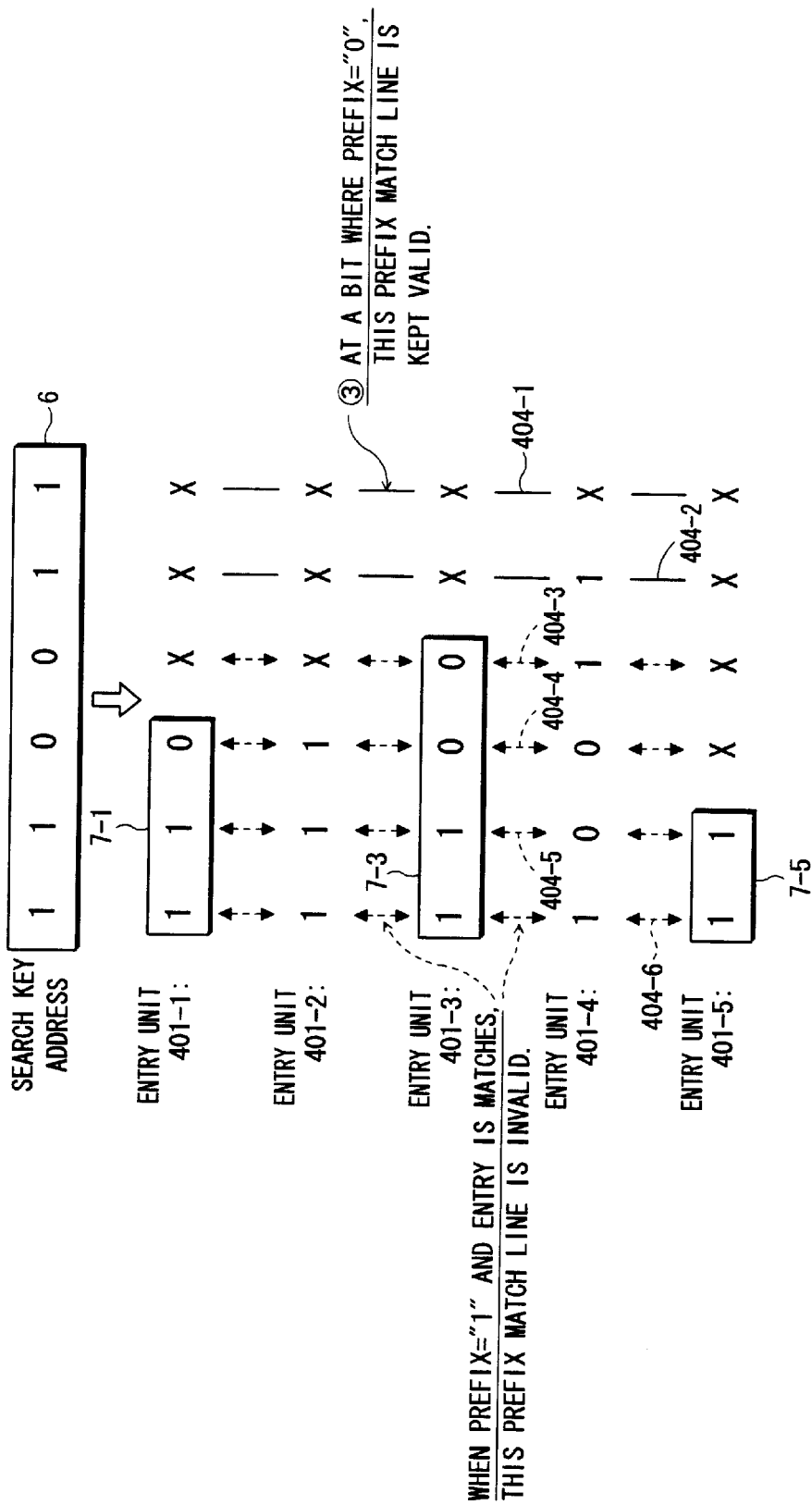

Within a range where a bit digit that is not masked exists in at least one entry data when mask identifying data in the entry data in the multi match state is compared, bits representing a state of the prefix match line 404-1, 404-2, . . . , or 404-5 become a string of continuous bits of "0" (shown by a broken line in FIG. 7), whereas a range where a bit digit that is masked exists in all the entry data becomes a string of bits of "1" (shown by a solid line in FIG. 7).

Now attention is paid to the lowest associative memory cell 410 among the associative memory cells 410 in which the mask identifying data "1" continues in the entry units 401-1, 401-3 and 401-5 in the multi match state. When the prefix match line of the lower bit seen from that associative memory cell 410 is invalid, it is seen that there is another matched entry unit, and that the relevant entry is not the entry having the longest prefix bit length (refer to ④ in FIG. 8).

Figure 8:
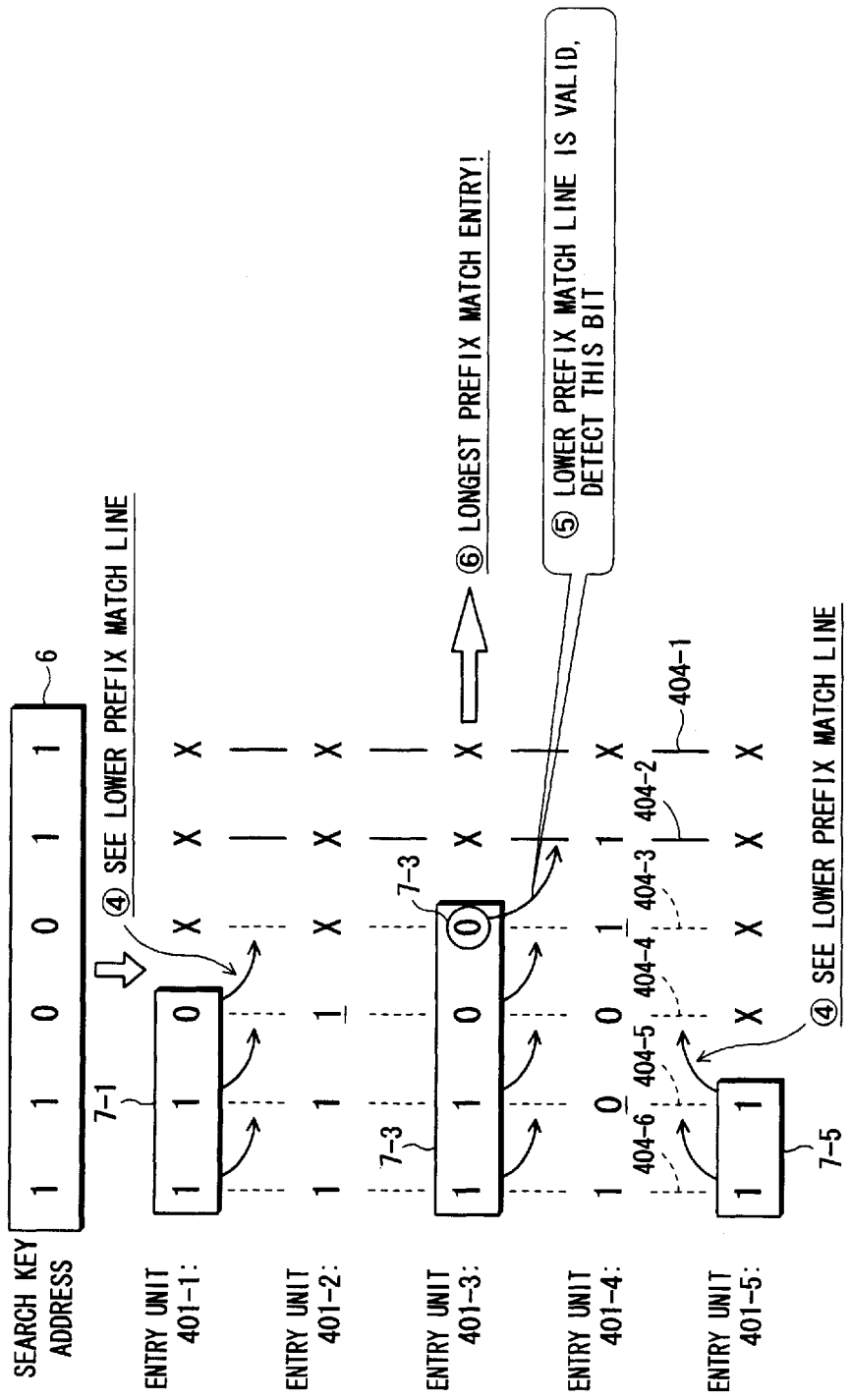

When a prefix match line at a lower bit seen from the lowest associative memory cell 410 is valid among the associative memory cells 410 in which the mask identifying data "1" continues, it is seen that that entry unit stores entry data of the longest prefix length (refer to ⑥ in FIG. 8)

For example, in the entry unit 401-1 in the multi match state, the associative memory cell 410 at the third higher bit is the lowest among the associative memory cells 410 in which the mask identifying data "1" continues. When attention is paid to the associative memory cell 410 at the third higher bit in the entry unit 401-1, the prefix match line 404-3 at the lower bit is invalid, so that it is seen that another matching entry unit exists and that entry is not the entry having the longest prefix bit length.

In this case, the AND circuit 407 in that associative memory cell 410 performs the AND operation between an output signal from the AND circuit 406 and a state signal of the prefix match line 403-3 at the adjacent lower bit digit. However, the prefix match line 403-3 is in the invalid state "0", so that the AND circuit 407 outputs "0".

In the associative memory cells 410 at the higher two bits of the entry unit 401-1, the AND circuits 407 of these associative memory cells 410 output "0" like the associative memory cell 410 at the third higher bit, since the prefix match lines 404-4 and 404-5 at the lower bits are in the invalid state "0". Further, in the associative memory cells at lower three bits in the entry unit 401-1, the AND circuits 407 output "0" since "0" is stored as the mask identifying bit in the mask registers 502.

Accordingly, the associative memory cells 410 at other bit digits in the entry unit 401-1 outputs "0". For this, the longest prefix match line 405-1 wired-OR-connected to the associative memory cells 407 outputs search non-match information "0". The longest prefix match line 405-5 of the entry unit 401-5 outputs the search non-match information "0," as well.

When attention is paid to the associative memory cell (the associative memory cell at the fourth higher bit) 410 storing the lowest bit among bit values "1" continuing as the mask identifying data in the entry unit 401-3 in the multi match state, the AND circuit 407 outputs "1" since the prefix match line 404-2 at a lower bit is valid (refer to ⑤ in FIG. 8).

The AND circuits 407 in the associative memory cells 410 at higher three bits in the entry unit 401-3 output "0" like the associative memory cells 410 at higher two bits in the above entry unit 401-1. The AND circuits 407 in the associative memory cells 410 at lower two bits in the entry unit 403-1 output "0" like the associative memory cells 410 at lower three bits in the entry unit 401-1.

In consequence, "1" is outputted from only the AND circuit 407 of the associative memory cell 410 at the fourth higher bit to the longest prefix match line 405-3 in the entry unit 401-3, so that "1" can be outputted as the search match information (refer to ⑥ in FIG. 8)

Meanwhile, the associative memory cells 410 of the entry units 401-2 and 401-4 storing entry data which are not in the multi match state among the entry units 401-1 to 401-5 output "0" as multi match line outputs, thus being invalid. For this, the longest prefix match lines 405-2 and 405-4 output the search non-match information "0".

The encoder 408 to which the above search match information has been inputted informs the output route determining unit 5-1 about the encoded search match information. The output route determining unit 5-1 performs a packet transferring process on the basis of output destination route information (output port information) obtained from the search result information from the CAM 400.

As above, in the associative memory apparatus 400 according to the first embodiment of this invention and the routing apparatus to which the associative memory apparatus 400 is applied, the AND circuits 406 and 407, and the longest prefix match lines 405-1 to 405-$n$ are provided to the entry units 401-1 to 401-$n$. Whereby, it is possible to decrease a load of the updating work, and shorten the time therefor, and readily cope with an increased capacity. It is also possible to output a result of the longest prefix matching in only one searching operation without a clock, thus shorten the searching time. Additionally, it is possible to simplify the updating work and contribute to speed-up of the IP network.

(a2) Description of First Modification of First Embodiment

In the associative memory apparatus 400 according to the above first embodiment, the associative memory cells 410 for all bits are used to match the address. According to this invention, address data and lower bits (for example, lower two bits) added thereto in the preceding stage of the address searching process may be used as a search key in the matching, as shown by the associative memory apparatus 400A in FIG. 9, for example.

In bit data that is used as a search key in the address searching process, higher bits excluding lower two bits are assigned for data of a destination address, while the lower two bits are assigned for weighting data for giving a weight in the matching of the destination address that is bit data to be searched.

In concrete, the lower two bits are bit data showing a priority given to a specific packet. The address searching in the CAM 200 is performed on the basis of the bit data showing a priority along with the above address data.

Figure 10:
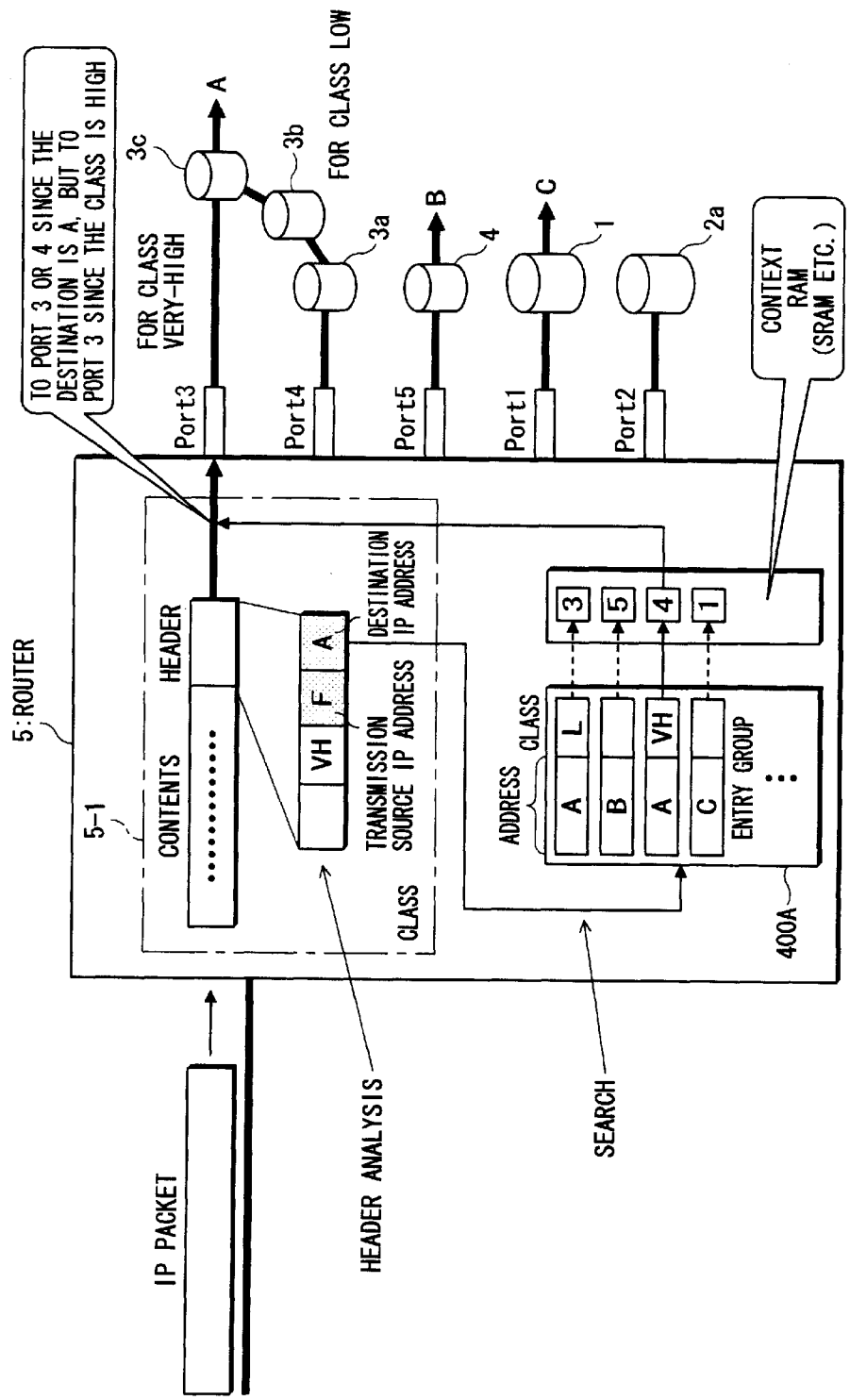
FIG. 10 is a diagram for illustrating an operation of a router according to the first modification of the first embodiment of this invention.

As shown in FIG. 10, for example, even if address data stored in the entry units 401-1 and 401-3 is identical as denoted by a reference character A, priority giving bits showing a lower priority "L" are stored at the lower bits in the entry unit 401-1. On the other hand, priority giving bits showing a higher priority "VH" are stored in the entry unit 401-3.

Even between the entry units 401-1 and 401-3 having the identical address data, it is possible to set different output ports according to the priority giving bits attached to the header of a packet.

When a packet having address data "A" is inputted as shown in FIG. 10, both of the entry units 401-1 and 401-3 match with the address data. However, bits showing the priority "VH" are stored at lower bits in the packet 6, thus the entry unit 401-3 is outputted as a matching address.

Namely, the above-described data of lower two bits is added for the purpose of performing a routing process having a higher priority on a specific packet in the preceding stage of the address searching process, then the address searching process by the CAM 400A is performed, whereby an application for QOS (Quality Of Service) or the like can be realized.

Incidentally, the data of lower two bits to be added in the preceding stage of the above address searching process is added when the above output route determining unit 5-1 performs address analysis, or added in an external router. The CAM 400A performs the address searching process with address data to which the lower order bits have been added as a search key.

For instance, when the output route determining unit 5-1 analyzes an address of an inputted IP packet and obtains class information 6C attached in an external router as a priority of the packet along with a destination address 6A and a transmission source IP address 6B from the header of the packet, not only the destination address 6A but also the class information 6C is used as a key for the searching process in the CAM 400A.

Figure 9:
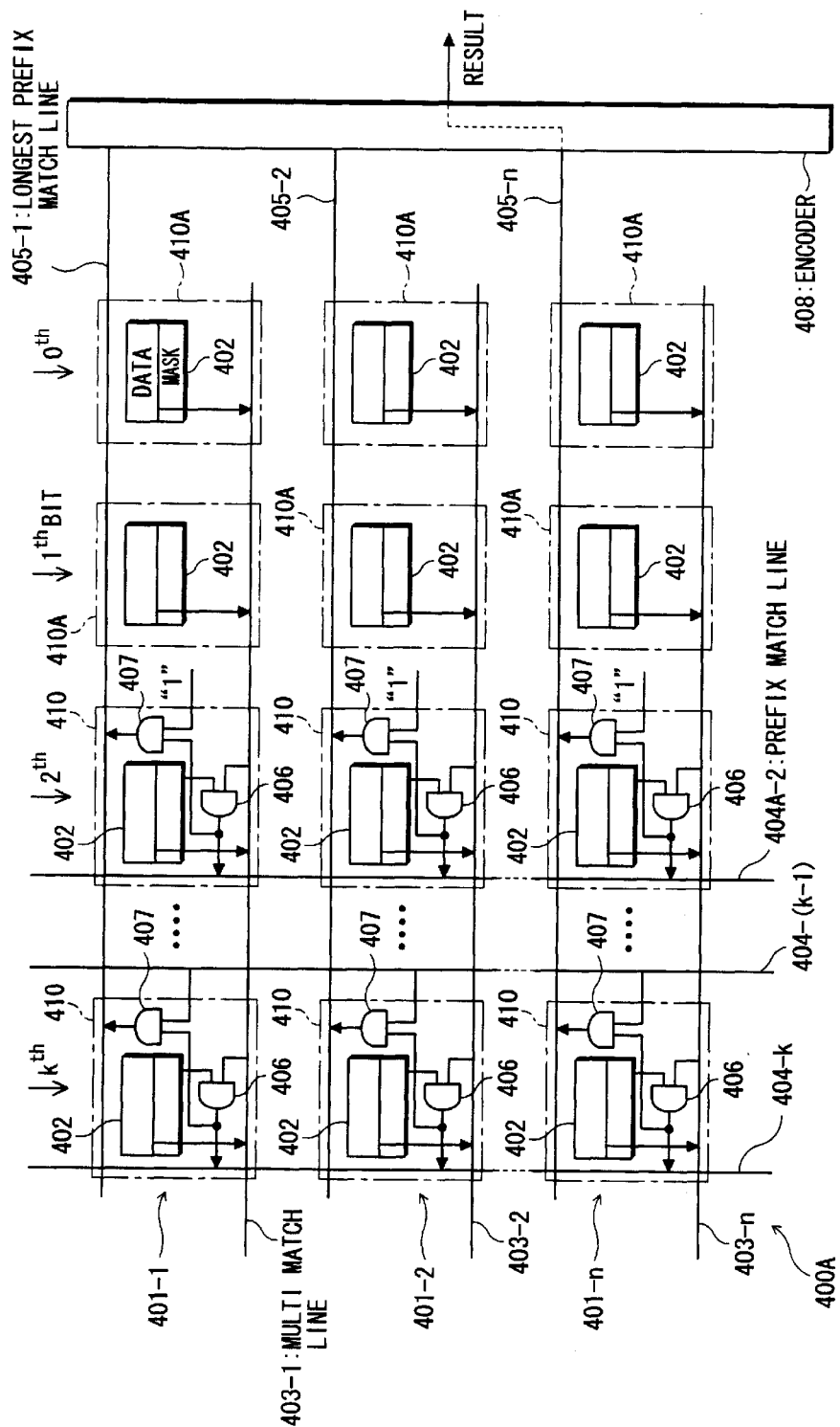
FIG. 9 is a diagram showing an associative memory cell according to a first modification of the first embodiment of this invention.

In the CAM 400A shown in FIG. 9, each of the associative memory cells 410A at lower two bits digits in the entry units 401-1 to 401-$n$ comprises a circuit unit 402 similar to that shown in FIG. 1. However, the associative memory cells 410A have no prefix match line (refer to reference characters 404 and 404-1 in FIG. 1), unlike the above CAM shown in FIG. 1. Other parts are basically similar to those shown in FIG. 1. Incidentally, like reference characters in FIG. 9 designate like or corresponding parts in FIGS. 1 and 2.

Each of the prefix match lines 404-2 to 404-$k$ is configured with a line stretched in common among the associative memory cells 410 which store bits at the same digit that is a part of entry data, that is, bits at the same digit at a higher bit other than lower two bits of the entry data.

The associative memory cells at lower two bit digits commonly have the multi-match line 403-1, 403-2, . . . , or 403-$n$ of a corresponding entry unit 401-1, 401-2, . . . , or 404-$n$, thereby joining to the matching by the associative memory cells 410 at the higher bits excluding the lower two bits.

In detail, the associative memory cell 410A comprises a circuit unit 402 having a data register 501, a mask register 502, a comparator 503 and a mask circuit 504, similarly to that shown in FIG. 2.

The above data register 501 and the mask register 502 store bit data relating to a priority attached to a specific IP packet, for example. Namely, the data register 501 and the mask register 502 store bit data showing a priority, whereby it is possible to determine an output port from which the packet should be outputted according to the priority between entry units in which the same destination address is stored.

The comparator 503 matches the bit data stored in the data register 501 and the mask register 502 with bits added to the address data that is a search key in order to accomplish the above QOS or the like. A result of the matching is outputted to a corresponding multi match line 403-1, 403-2, . . . , or 403-$n$.

To the AND circuits 407 of the associative memory cells (the associative memory cells among which the prefix match line 404-2 is stretched) 410 at a digit of the third lower bit, a fixed value "1" is inputted instead of a state value signal from the prefix match line at the preceding digit.

Accordingly, each of the entry units 401-1 to 401-$n$ can match entry data composed of prefix bits not masked having the longest k−2 bits.

With the above structure, the associative memory apparatus 400 according to the first modification of the first embodiment matches address data (bit data) that is a search key with entry data stored in each of the entry units 401-1 to 401-$n$, and outputs entry data having the longest prefix bit length among coinciding entry data (in the multi match state) in the matching as a search match result to the encoder 408, basically similarly to the above first embodiment.

In the associative memory apparatus 400A shown in FIG. 9, two bits, for example, are beforehand added to lower digits of address data that is a search key in the preceding stage of the above address searching process by an application for realizing QOS or the like.

The associative memory cells 410A at digits of lower two bits in each of the entry units 401-1 to 401-$n$ match bit data added to the lower two bits of the above address data, and output results of the matching to the corresponding multi-match line 403-1, 403-2, . . . or 403-$n$. The multi match state is determined on the basis of the bits added in the preceding stage of the address searching process together with address data attached to the packet.

According to the first modification of the first embodiment, lower two bits of entry data may be used as weighting bits for giving a weight in the matching of a destination address that is bit data to be searched. Therefore, the first modification can provide not only the similar advantages to those provided by the first embodiment described above, but also advantages that bits can be added as the above lower two bits by an application for the purpose of realization of QOS (Quality Of Service) or the like, the searching speed can be improved similarly to the associative memory apparatus, and a system performing an optimum searching process in conformity with a mode of use by the user can be readily configured.

Further, it is possible to decrease an area of a cell of the CAM 400A as compared with that (reference character 400) according to the first embodiment, so that a size of the apparatus can be decreased by decreasing the area of the chip.

(a3) Description of Second Modification of First Embodiment

Figure 11:
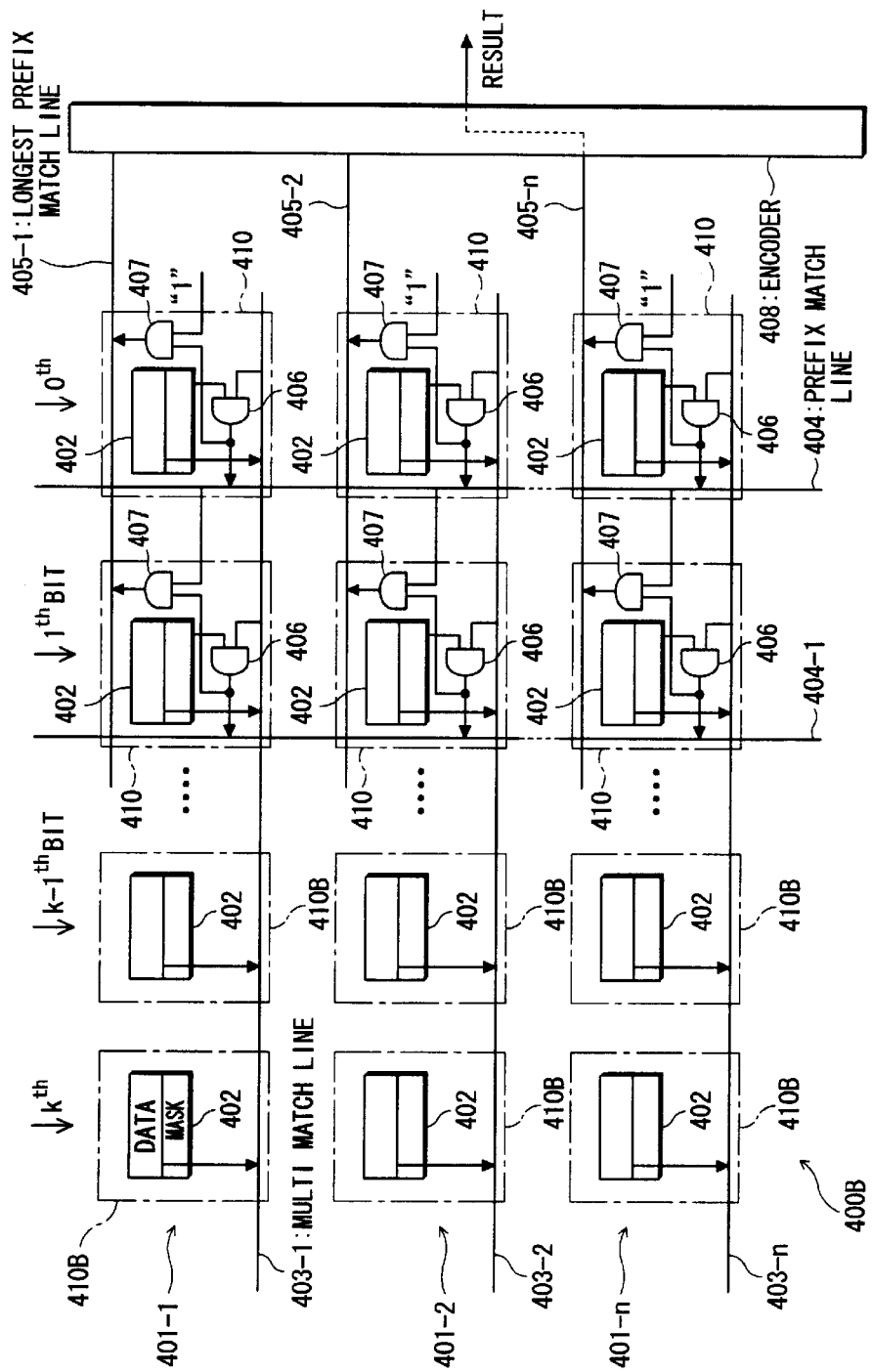
FIG. 11 is a diagram showing an associative memory apparatus according to a second modification of the first embodiment of this invention.

FIG. 11 is a diagram showing a CAM 400B according to a second modification of the first embodiment of this invention. As shown in FIG. 11, it is possible to use address data and not lower bits but higher bits (for example, higher two bits) attached to the address data in the preceding stage of the address searching process as a search key.

In bit data as a search key used in the address searching process, lower bits excluding higher two bits are composed of data of a destination address, while higher two bits are used as weighting bits to weight in the matching of a destination address that is bit data to be searched.

In concrete, higher two bits may be bit data showing a priority given to, for example, a specific packet, and the address searching in the CAM 400B may be performed on the basis of the above address data together with the bit data showing a priority.

Data of two bits added in the preceding stage of the address searching process may be used as added bits to realize QOS or the like by an application, by performing a routing process having a higher priority on a specific packet in the routing process, for example.

In the associative memory apparatus 400B shown in FIG. 11, each of the associative memory cells 410B at digits of higher two bits in each of the entry units 401-1 to 401-$n$ comprises a circuit unit 402 similar to that shown in FIG. 1. However, the associative memory cells 410B have no prefix match line (refer to reference characters 404-($k$–1) and 404-$k$ in FIG. 1) unlike the associative memory apparatus 400 shown in FIG. 1. The other parts are basically similar to those shown in FIG. 1. Incidentally, like reference characters in FIG. 11 designate like or corresponding parts in FIGS. 1 and 2.

Namely, each of the prefix match lines 404, 404-1 to 404-($k$–2) is configured with a line stretched in common among associative memory cells 410 storing bits at the same digit that is a part of entry data, that is, bits at the same digit in lower bits excluding higher two bits of each entry data.

Each of the associative memory cells 410B at digits of higher two bits comprises a circuit unit 402 having a data register 501, a mask register 502, a comparator 503 and a mask circuit 504. The associative memory cell 410B matches bit data stored in the data register 501 and the mask register 502 with bits added to address data that is a search key for realizing the above QOS or the like.

Each of the entry units 401-1 to 401-$n$ can match entry data composed of prefix bits not masked having the longest $k$-2 bits.

With the above structure, the associative memory apparatus 400B according to the second modification of the first embodiment matches address data (bit data) that is a search key with entry data stored in each of the entry units 401-1 to 401-$n$, and outputs entry data having the longest prefix bit length among coinciding entry data (in the multi match state) in the matching as a search match result to the encoder 408, basically similarly to the first embodiment.

In the associative memory apparatus 400B, two bits, for example, are beforehand added to higher digits of address data that is a search key by an application in the preceding stage of the address searching process to realize QOS or the like.

The associative memory cells 410A at digits of higher two bits in each of the entry units 401-1 to 401-$n$ match bit data added to higher two bits of the above address data in the address searching process, and output a result of the matching to a corresponding multi match line 403-1, 403-2, . . . , or 403-$n$. Whereby, the multi match state is determined on the basis of the bits added in the preceding stage of the address searching process together with the address data attached to a packet.

According to the second modification of the first embodiment, higher two bits of entry data may be used as weighting bits to give a weight in the matching of a destination address that is bit data to be searched. The second modification of the first embodiment can therefore provide similar advantages to those provided by the first modification of the first embodiment described above.

(b1) Description of Second Embodiment

Figure 12:
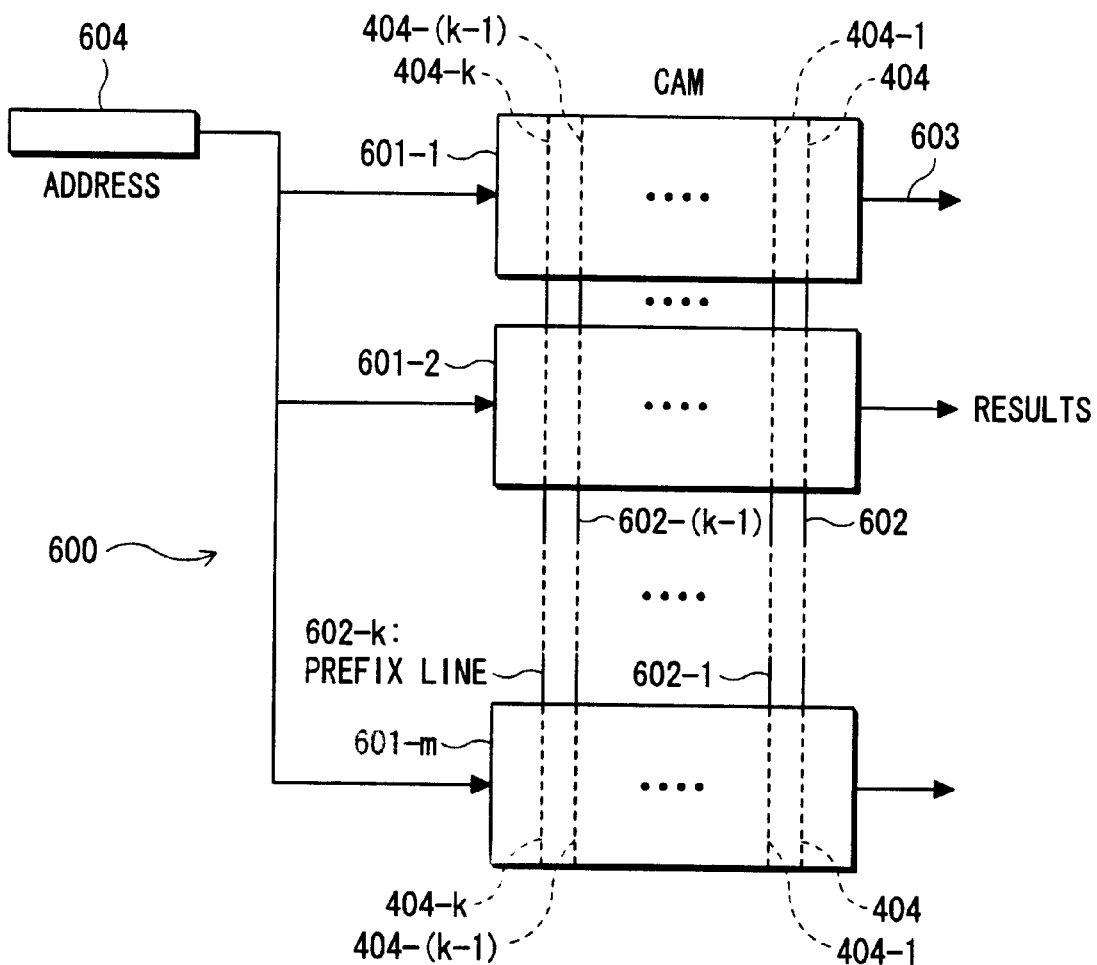
FIG. 12 is a diagram showing an associative memory apparatus according to a second embodiment of this invention.

FIG. 12 is a diagram showing an associative memory apparatus according to a second embodiment of this invention. The associative memory apparatus 600 shown in FIG. 12 may be applied in a router 5 similarly to the first embodiment.

In the associative memory apparatus 600 according to the second embodiment, a plurality of CAMs 604-1 to 601-$m$ having a structure similar to that of the CAM (refer to reference character 400) according to the first embodiment are cascade-connected through external connection lines 602-, 602-1, . . . , and 602-$k$.

The external connection lines 602, 602-1, . . . , and 602-$k$ serially connect the respective prefix match lines 404, 404-1, . . . , and 404-$k$ (refer to FIG. 1) in each of the CAMs 601-1 to 601-$m$.

Each of the CAMs 601-1 to 601-$m$ as an entry block comprises a plurality of entry units (refer to reference characters 400-1 to 400-$n$ in FIG. 1) and an encoder (refer to a reference character 408), like the CAM 400 shown in FIG. 1. The external connection lines 602, 602-1, . . . , and 602-$k$ function as an external connecting means for connecting a plurality of the CAMs 601-1 to 601-$m$ to one another.

The prefix match lines 404, 404-1, . . . , and **404-*k* in each of the CAMs 601-1 to 601-*m* can output information mutually reflected among the entry units 401-1 to 401-*n* configuring the corresponding CAM 601-1, 601-2, . . . , or 601-*m* through the external connection lines 602, 602-1, . . . , and 602-*k*.**

Each of the CAMs 601-1 to **601-*m* comprises the encoder. An output route determining unit (refer to a reference character 5-1 in FIG. 3**) can determine an output port for a packet using outputs of the encoders.

By connecting a plurality of the CAMs each similar to that according to the first embodiment, it is possible to increase entry data that the whole of the CAMs 601-1 to **601-*m*** can accommodate.

In the case where the associative memory apparatus 600 according to the second embodiment of this invention is applied to the router 5 (refer to FIG. 3), when the output route determining unit 5-1 searches for an output destination route for the inputted packet 6, the output route determining unit 5-1 searches in the associative memory apparatus 600 with a destination address data 604 attached to the packet 6 as a search key to obtain the output destination route, basically similarly to the first embodiment.

Namely, the output route determining unit 5-1 in the router 5 delivers bit data as a destination address for the packet 6 to the associative memory apparatus 600. The associative memory apparatus 600 searches in stored address data with the delivered bit data of the destination address as a search key to determine to which output port #1, #2, . . . , or #5 the inputted address data of the packet should be transferred, and sends back a result of the search to the above output route determining unit 5-1.

The associative memory apparatus 600 performing such the searching operation outputs information mutually reflected among the entry units 401-1 to **401-*n* configuring each of the CAMs 601-1 to 601-*m* through the external connection lines 602, 620-1, . . . , and 602-*k*. Therefore, the associative memory apparatus 600 can search for entry data coinciding with the address data 604 that is a search key and having the longest prefix bits among entry data stored in the entry units 401-1 to 401-*n* configuring each of the CAMs 601-1 to 601-*m*** in one searching operation.

In other words, the CAMs 601-1 to **601-*m*** can operate in parallel, so that a result of the searching can be outputted without taking plural times of the searching step, similarly to the first embodiment described above.

In the associative memory apparatus 600 according to the second embodiment of this invention, a plurality of CAMs 601-1 to **601-*m* can be connected to one another through the external connection lines 602, 602-1, . . . , and 602-*k*. Accordingly, the second embodiment provides advantages of increasing data that the associative memory apparatus 600** can accommodate as the whole, and readily coping with an increase in number of the entries in the network, along with similar advantages provided by the first embodiment.

(b2) Description of First Modification of Second Embodiment

Figure 13:
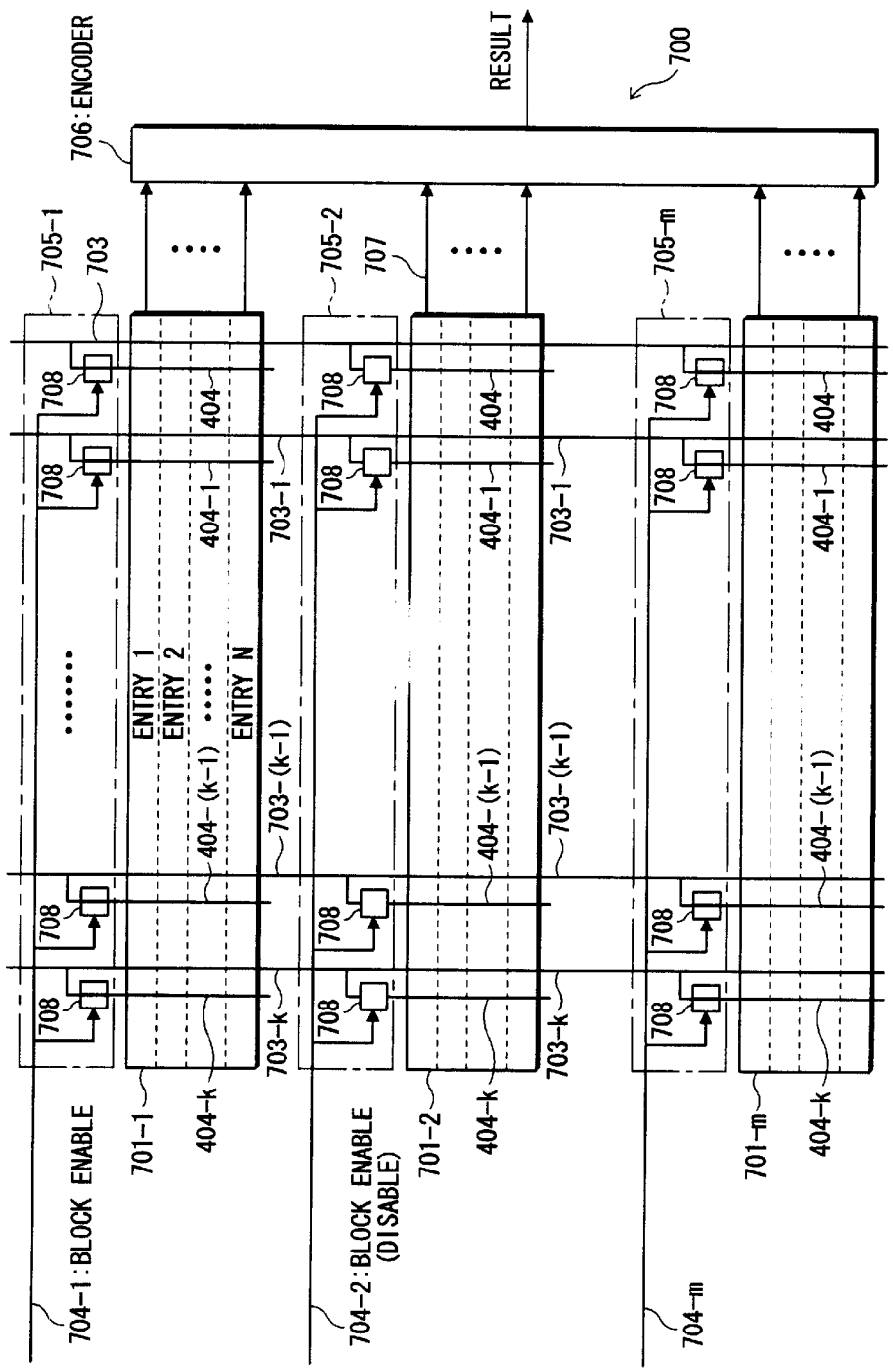
FIG. 13 is a diagram showing an associative memory apparatus according to a first modification of the second embodiment of this invention.

FIG. 13 is a diagram showing an associative memory apparatus according to a first modification of the second embodiment of this invention. In the associative memory apparatus 700 shown in FIG. 13, a plurality of CAMs 701-1 to **701-*m* having the similar structure to the CAM (refer to reference character 400) according to the above first embodiment are connected to increase the number of entries that the associative memory apparatus 700 can accommodate, like the associative memory apparatus (refer to reference character 600) according to the second embodiment. However, a mode in which the CAMs 701-1 to 701-*m*** are connected is different.

In the associative memory apparatus 700 shown in FIG. 13, the external connection lines 703, 703-1, . . . , and **703-*k* as the external connecting means connect in parallel the prefix match lines 404, 404-1, . . . , and 404-*k* of the CAMs 701-1 to 701-*m*.**

In other words, the external connection lines 703, 703-1, . . . , and **703-*k* and the prefix match lines 404, 404-1, . . . , and 404-*k* are hierarchically connected, the external connection lines 703, 703-1, . . . , an 703-*k* functioning as main prefix match lines in a higher layer, whereas the prefix match lines 404, 404-1, . . . , and 404-*k*** functioning as sub prefix match lines in a lower layer.

The above external connection lines 703, 703-1, . . . , and **703-*k* have control circuit units 705-1 to 705-*m* for the respective CAMs 701-1 to 701-*m* to disconnect the prefix match lines 404, 404-1, . . . , and 404-*k*** to control them.

Each of the control circuit units 705-1 to **705-*m* comprises control circuits 708 for disconnecting the prefix match lines 404, 404-1, . . . , and 404-*k* in each of the CAMs 701-1 to 701-*m* to control them according to a block control signal 704-1, 704-2, . . . , or 704-*m* inputted from the outside, so as to control an enable or disable state of each of the CAMs 701-1 to 701-*m*.**

In other words, it is possible to disconnect at least one of the CAMs 701-1 to **701-*m* as a plurality of entry blocks connected from one another through the external connection lines 703, 703-1, . . . , and 703-*k*, and control it by the control circuit unit 705-1, 705-2, . . . , or 705-*m*.**

In FIG. 13, the control circuits 708 in the control unit units 705-1 and **705-*m* are such controlled that the CAMs 702-1 and 701-*m* are brough into the enable state to be connected to the external connection lines 703, 703-1, . . . , and 703-*k*, whereas the CAM 701-2 is brought into the disable state to be disconnected from the external connection lines 703, 703-1, . . . , and 703-*k*.**

It is possible to control the CAM 701-2 as an entry block to be excluded from the above longest prefix match searching.

The reference numeral 706 designates an encoder. The encoder 706 outputs a search match result to an output route determining unit not shown on the basis of outputs of longest match prefix match signals (refer to reference characters 405-1 to **405-*n* in FIG. 1) from the CAMs 701-1 to 701-*m*** as entry blocks.

With the above structure, the associative memory apparatus 700 according to the first modification of the second embodiment of this invention can search for entry data coinciding with address data that is a search key and having the longest prefix bit length among entry data stored in the entry units (refer to reference characters 401-1 to **401-*n* in FIG. 1) configuring each of the CAM 701-1 to 701-*m*** when the block control signals are all in the enable state, similarly to the above second embodiment.

When any one of block control signals 704-1 to **704-*m* for controlling states of the control circuit units 750-1 to 705-*m* is inputted as the block disable signal, the relevant control circuit unit 705-1, 705-2, . . . , or 705-*m* disconnects the corresponding CAM 701-1, 701-2, . . . , or 701-*m* from the external connection lines 703, 703-1, . . . , and 703-*m*. It is thereby possible to exclude the disconnected CAM 701-1, 701-2, . . . , or 703-*m*** from objects of the above searching operation.

Meanwhile, it is possible to independently perform the updating work on the CAM 701-1, 701-2, . . . , or **701-*m*** which has been excluded from objects of the searching operation, while the other CAMS in the enable state are in operation. Additionally, by disconnecting a CAM storing an address group on which no searching operation is required, it is possible to reduce a wiring load to the disconnected CAM.

According to the first modification of the second embodiment of this invention, a plurality of the CAMs 701-1 to 701-*m* are connected to one another by the external connection lines 703, 703-1, . . . , and 703-*k*, and the control circuit units are interposed. Accordingly, the first modification of the second embodiment can provide an advantage that the updating work can be independently done on a disconnected CAM, thus can contribute to convenience of the network management, along with the advantages similar to those provided by the above second embodiment.

During operation, a CAM storing an address group on which no searching operation is required is disconnected, whereby the wiring load on the disconnected CAM is reduced. This allows speed-up of the searching operation, and reduction of the power consumption for driving the circuit.

In the above first modification of the second embodiment, CAMs each of one chip as an entry block are connected to form a hierarchy of plural chips. However, this invention is not limited to this example. Alternatively, one chip may include a plurality of entry blocks (configured with a plurality of entry units), and the multi match lines 404, 404-1, . . . , and 404-*k* in each of the entry blocks may be hierarchically connected (connected in parallel) by the external connection lines 703, 703-1, . . . , and 703-*k*.

If the multi match lines 404, 404-1, . . . , and 404-*k* are hierarchically connected (connected in parallel) in each of the entry blocks in the CAM on one chip, the similar advantages to the above may be provided.

(b3) Description of Second Modification of Second Embodiment

Figure 14:
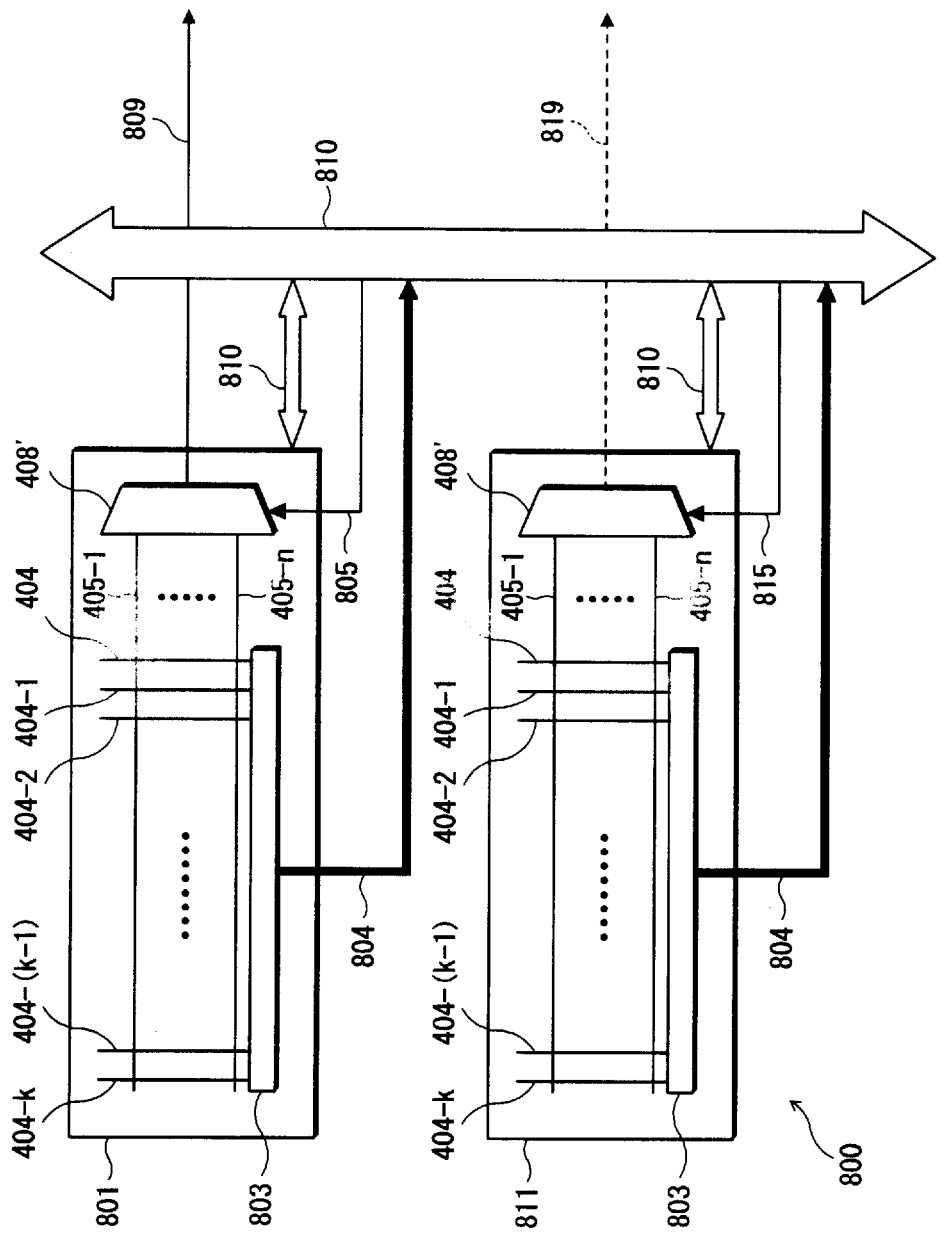
FIG. 14 is an associative memory apparatus according to a second modification of the second embodiment of this invention.

FIG. 14 is a diagram showing an associative memory apparatus according to a second modification of the second embodiment of this invention. In the associative memory apparatus 800 shown in FIG. 14, a plurality (two) of CAMs 801 and 811 are connected, like the above associative memory apparatuses shown in FIGS. 12 and 13. However, the structure of each of the CAMs 801 and 811, and a mode of connecting the CAMs 801 and 811 are different.

Each of the CAMs 801 and 811 comprises an encoder (encoding means) for encoding output signals from respective prefix match lines 404, 404-1 to 404-*k* as the matching-masking state outputting means, unlike the CAM 400 according to the above first embodiment. The other parts are basically similar to those of the CAM 400 according to the first embodiment. Incidentally, like reference characters in FIG. 14 designate like or corresponding parts in FIG. 1.

In the associative memory apparatus 800 shown in FIG. 14, the CAMs 801 and 811 are connected to each other by a bus 810. An encode output signal (refer to a reference character 804) from each of the encoders 803 can be outputted to the outside through the bus 810 as an external connecting means.

In other words, the bus can perform a bus communication of output signals encoded by the encoders 803 between the CAMs 801 and 811 as entry blocks.

A control unit not shown connected through the bus 810 has functions of bus control and arbitration of CAMs 801 and 811, which can include a function as the output route determining unit (refer to a reference character 5-1 in FIG. 3).

Namely, the control unit can notify the CAMs 801 and 811 of address data that is a search key through the bus 810.

Each of the CAMs 801 and 811 can thereby extract entry data having the longest prefix bits among entry data matching with the search key.

The control unit compares lengths of the prefix bits of entry data which have matched in the CAMs 801 an 811 on the basis of encode output signals inputted from the encoders 803 of the CAMs 801 and 811 through the bus 810, and instructs encoders 408' of the CAMs 801 and 811 through the bus 810 to receive a longest prefix match signal from the CAM 801 or 811 having entry data of longer prefix bits as a result of the searching (refer to reference characters 805 and 815 in FIG. 14).

Namely, in each of the encoders 408' of the CAMs 801 and 811, a longest prefix match result can be obtained. On the basis of an instruction from the control unit having received the encode output signals outputted from the encoders 803 in the CAMs 801 and 811, one longest prefix match result can be obtained from these two longest prefix match results in the two CAMs 801 and 811 as a whole.

In FIG. 14, the signals 804 and 805 are shown, discriminated from the bus 810. However, it is unnecessary to provide separate input-output ports for connecting to the bus 810 for the respective signals, but it is possible to provide a common single input-output port.

In the associative memory apparatus 800 with the above structure, the control unit not shown notifies each of the CAMs 801 and 811 of address data that is a search key through the bus 810. Each of the CAMs 801 and 811 extracts entry data having the longest prefix bits among entry data matching with the search key, almost similarly to the above first embodiment.

The control unit compares lengths of prefix bits of longest-prefix-matched entry data in the CAMs 801 and 811 on the basis of encode output signals inputted from the encoders 803 of the CAMs 801 and 811 through the bus 810, and instructs the encoders 408' of the CAMs 801 and 811 through the bus 810 to receive a longest prefix match signal having entry data of longer prefix bits from the CAM 801 or 811 as a result of the searching.

The encoders 408' of the CAMs 801 and 811 receive the instruction from the control unit through the bus 810. Whereby, it is possible to obtain one longest prefix match result between the longest prefix match results of the two CAMs 801 811 as a whole.

When a prefix bit length of entry data obtained as a result of the longest prefix matching from the CAM 801 is longer than one from the CAM 811, for example, an output from the encoder 408' of the CAM 811 (refer to reference character 819 in FIG. 14) is masked, while the obtained longest prefix match result is outputted from the encoder 408' of the CAM 801 as a search match result (refer to reference character 809 in FIG. 14).

The associative memory apparatus according to the second modification of the second embodiment of this invention comprises the encoders 803, thereby encoding output signals from the prefix match lines 404, 404-1, . . . , and 404-*k* of the CAMs 801 and 811, and outputting them. It is therefore possible to decrease the number of pins for outputting signals to the outside, and suppress an increase of the number of the pins even if address bits are increased with improvement of the network or expansion of the scale of the network when IPv6 is introduced, for example.

(c) Others

In the above embodiments, the associative memory apparatus according to this invention is applied to a network in IP layer, in concrete, to a router routing an IP packet. However, this invention is not limited to this example, but may be applied when the searching operation is performed in a network in other than IP layer.

What is claimed is:

1. An associative memory apparatus comprising:
   a plurality of entry units respectively storing entry data different from one another having bit data to be searched and mask identifying data for masking a necessary bit length in said bit data, and matching each of said entry data with said bit data that is a search key;
   a matching-masking state outputting means inputted information reflecting a result of said matching in units of the same bit digit in each of said entry unit and a mask identifying bit at said bit digit to output reflected result information mutually reflected among said entry units at each bit digit;
   each of said entry units comprising:
      a logical operating means for outputting information about a bit length not masked of said entry data by a logical operation using said reflected result information from said matching-masking state outputting means when said entry data stored in its own entry unit matches with said bit data that is said key as a result of said matching; and
      a search result outputting means for outputting search match information about said search key on the basis of an output signal from said logical operating means only when said entry data stored in its own entry unit is entry data having the longest bit length not masked among all entry data coinciding with said bit data that is said key in said matching.

2. The associative memory apparatus according to claim 1, wherein said entry unit comprises:
   associative memory cells in number equal to at least bits of said entry data to divide said entry data into data each of one bit and storing said data, and matching said entry data with said bit data that is said search key in units of divided one bit; and
   a matching result outputting means for reflecting results of matching from said associative memory cells to output information about whether a whole of said entry data coincides with said bit data that is said key as a result of the matching.

3. The associative memory apparatus according to claim 2, wherein said associative memory cell comprises a data register for dividing said data to be searched into data each of one bit and storing said divided data, a mask register for storing a mask identifying bit corresponding to said data of one bit stored in said data register, and a matching circuit for matching said bit data that is said key with said entry data in units of divided one bit using bits stored in said data register and said mask register, and said logical operating means comprising a logical operation circuit for performing a logical operation in units of said divided one bit;
   said logical operation circuit comprises:
      a first logical operation element, only when information that a mask identifying bit from said mask register represents that data of one bit stored in a corresponding data register is not masked and information about coincidence between said entry data and said bit data as a result of said matching from said matching result outputting means are inputted, outputting this effect as a first operation result to said matching-mask state outputting means;
      a second operation element, only when a logical operation result from said first logical operation element is said first operation result and an output result from said matching-masking state outputting means at the adjacent bit digit is other than said first operation result, outputting this effect as a second operation result to said search result outputting means;
   said search result outputting means outputs said search match information when inputted said second operation result from said second logical operation element.

4. The associative memory apparatus according to claim 2, wherein said matching-masking state outputting means is configured with a line stretched in common among said associative memory cells storing bits at the same digit of said entry data.

5. The associative memory apparatus according to claim 1 further comprising an external connecting means for connecting a plurality of entry blocks to one another, each of which entry blocks comprises a plurality of said entry units, wherein said matching-masking state outputting means outputs said result information mutually reflected among said entry units configuring each of said entry blocks through said external connecting means.

6. The associative memory apparatus according to claim 5, wherein said external connecting means connects in series said matching-masking state outputting means in each of said entry blocks.

7. The associative memory apparatus according to claim 5, wherein said external connecting means connects in parallel said matching-masking state outputting means in each of said entry blocks.

8. The associative memory apparatus according to claim 5, wherein a control circuit unit for disconnecting at least one entry block among a plurality of said entry blocks connected to one another is interposed in said external connecting means.

9. The associative memory apparatus according to claim 5, wherein each of said entry blocks comprises an encoding means for encoding output signals from said matching-masking state outputting means, and said external connecting means comprises a bus line being able to bus-communicate said output signals encoded by said encoding means among said entry blocks.

10. The associative memory apparatus according to claim 2, wherein said matching-masking state outputting means is configured with a line stretched in common among said associative memory cells storing bits at the same digit each of which is a part of each entry data.

11. The associative memory apparatus according to claim 10, wherein said matching-masking state outputting means is configured with a line stretched in common among said associative memory cells storing bits at the same digit in higher order bits excluding at least lower order one bit of each entry data.

12. The associative memory apparatus according to claim 10, wherein said matching-masking state outputting means is configured with a line stretched in common among said associative memory cells storing bits at the same digit in lower order bits excluding at least higher order one bit of each entry data.

13. The associative memory apparatus according to claim 11, wherein at least lower order one bit of each of said entry data is a weight bit giving a weight in matching of bit data to be searched.

14. The associative memory apparatus according to claim 12, wherein at least higher order one bit of each of said entry data is a weight bit giving a weight in matching of bit data to be searched.

15. The associative memory apparatus according to claim 3, wherein said search result outputting means is configured with a wired-connection line wired-connecting output signals from said second logical operation elements.

16. The associative memory apparatus according to claim 3, wherein said matching-masking state outputting means is configured with a wired-connection line wired-connecting output signals from said first logical operation elements.

17. The associative memory apparatus according to claim 3, wherein said first logical operation element or said second logical operation element is configured with a CMOS logical circuit.

18. The associative memory apparatus according to claim 3, wherein said first logical operation element or said second logical operation element is configured with an NMOS logical circuit.

19. The associative memory apparatus according to claim 3, wherein said first logical operation element or said second logical operation element is configured with a PMOS logical circuit.

20. A routing apparatus comprising an associative memory storing a destination address correspondingly to an output destination route, and an output route determining unit analyzing a destination address attached to an inputted packet, and performing a routing process such that said packet is transferred to an output destination route obtained by referring to said associative memory, said routing apparatus comprising:

said associative memory cell comprising:
 a plurality of entry units for respectively storing entry data different from one another having bit data configuring a destination address to be searched and mask identifying data for masking a necessary bit length in said bit data, and matching said entry data with said bit data configuring the destination address that is a search key;
 a matching-masking state outputting means inputted information reflecting a result of said matching in units of the same bit digit in each of said entry units and a mask identifying bit at said bit digit to output reflected result information mutually reflected among said entry units at each bit digit;
each of said entry units comprising:
 a logical operating means for outputting information about a bit length not masked of said entry data by a logical operation using said reflected result information from said matching-masking state outputting means when said entry data stored in its own entry unit matches with said bit data that is a key as a result of said matching; and
 a search result outputting means for outputting search match information about said search key on the basis of an output signal from said logical operating means only when the entry data stored in its own entry unit is entry data having the longest bit length not masked among all entry data coincides with said bit data that is a key in said matching.

* * * * *